(12) United States Patent
Krusin-Elbaum et al.

(10) Patent No.: US 7,221,579 B2
(45) Date of Patent: May 22, 2007

(54) METHOD AND STRUCTURE FOR HIGH PERFORMANCE PHASE CHANGE MEMORY

(75) Inventors: Lia Krusin-Elbaum, Dobbs Ferry, NY (US); Rudolf Ludeke, Millwood, NY (US); Dennis M. Newns, Yorktown Heights, NY (US); Simone Raoux, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 11/150,188

(22) Filed: Jun. 13, 2005

(65) Prior Publication Data

US 2006/0279978 A1    Dec. 14, 2006

(51) Int. Cl.
*G11C 13/04* (2006.01)
(52) U.S. Cl. ............ 365/148; 365/157; 365/158
(58) Field of Classification Search ........ 365/148, 365/113, 163
See application file for complete search history.

(56) References Cited

U.S. PATENT DOCUMENTS

| | | | | |
|---|---|---|---|---|
| 4,586,164 | A * | 4/1986 | Eden ................. | 365/127 |
| 5,166,758 | A * | 11/1992 | Ovshinsky et al. ....... | 257/3 |
| 6,828,081 | B2 * | 12/2004 | Chen et al. ............ | 430/311 |
| 6,859,389 | B2 * | 2/2005 | Idehara .............. | 365/163 |
| 6,891,747 | B2 * | 5/2005 | Bez et al. ............ | 365/158 |
| 7,110,286 | B2 * | 9/2006 | Choi et al. ........... | 365/163 |
| 2002/0131309 | A1 * | 9/2002 | Nishihara et al. ....... | 365/200 |

OTHER PUBLICATIONS

Young-Tae Kim, et al. "Study on Cell Characteristics of PRAM using the Phase -Change Simulation", 0-7803-7826-1/03 IEEE, pp. 211-214, 2003.
Stefan Lai, et al. "OUM-A 180 nm Nonvolatile Memory Cell Element Technology For Stand Alone and Embedded Applications", IEDM Tech. Dig., pp. 36.51-36.54, 2001.
Jon Maimon, et al. "Chalcogenide-Based Non-Volatile Memory Technology", IEEE Aerospace Conf. Proc., pp. 5-2289-5-2294, 2001.
Scott Tyson, et al. "Nonvolatile, High Density, High Performance Phase-Change Memory", IEEE Aerospace Conf. Proc., pp. 385-390, 2000.
C.A. Volkert, et al. "Modeling of Laser Pulsed Heating and Quenching in Optical data Storage Media", Journal of Applied Physics, vol. 86, No. 4, pp. 1808-1816, 1999.
Chubing Peng, et al. "Experimental and Theoretical Investigations of Laser-Induced Crystallization and Amorphization in Phase-Change Optical Recording Media", Journal of Applied Physics, pp. 4183-4191, 1999.
Meikei Ieong, et al. "Silicon Device Scaling to the Sub-10nm Regime" Science vol. 306, pp. 2057-2060, 2005.

(Continued)

*Primary Examiner*—Tan T. Nguyen
(74) *Attorney, Agent, or Firm*—Ido Tuchman, Esq.; McGinn IP Law Group, PLLC

(57) ABSTRACT

A method (and structure) for a memory cell having a phase change material (PCM) element and a heating element external to the PCM element. The heating element causes one of a presence of and an absence of a phase boundary within the PCM element for storing information in the PCM element.

20 Claims, 17 Drawing Sheets

OTHER PUBLICATIONS

K.W. Schlichting, et al. "Thermal Conductivity of Dense and Porous", J. Materials Science, vol. 36, pp. 3003-3010, 2001.

"Applied Thin Films, Inc.", http://www.atfinet.com/tbc_main.htm, 2004, pp. 1-2.

Jie Wu, et al. "Thermal Conductivity of Ceramics in the ZrO2-GdO1.5 Systems" J. Materials Research, vol. 17, No. 12, pp. 3193-3200, 2002.

C. J. Tymczak, et al. "Asymmetric Crystallization and Melting Kinetics in Sodium: A Molecular-Dynamics Study", 1990 The American Physical Society, vol. 64, No. 11, pp. 1278-1281.

S. Privitera, et al., "Amorphous-to-Polycrystal Transition in GeSb TeThin Films", Materials Research Science Symp. Proc., vol. 803, pp. HH1.4.1-HH1.4.6, 2004.

* cited by examiner

METHOD AND STRUCTURE FOR HIGH PERFORMANCE PHASE CHANGE MEMORY

BACKGROUND OF THE INVENTION

1. Field of the Invention

The present invention generally relates to phase change memory, typically referred to as PRAM. More specifically, a heater element external to a phase change material (PCM) element, in combination with using only a thin layer of the PCM element for storing the information state of the memory unit, greatly improves speed and controllability.

2. Description of the Related Art

Up until the advent of the present invention described herein, phase change memory (phase change random access memory or PRAM) has been considered as a relatively slow, but nonvolatile, form of memory in a similar category to FLASH memory. It would be highly desirable to design a PRAM which has a much higher performance and is capable of competing as a nonvolatile memory in the role of DRAM, including embedded applications.

Dynamic random access memory (DRAM), the most widely used form of memory in computers, has several well-known disadvantages, including the characteristic that memory is lost when the computer or device is switched off. DRAM is also relatively slow. Moreover, it would be desirable to significantly reduce the memory footprint (e.g., the area occupied by the memory cell).

Phase change memory, or PRAM, is based on a phase change material (PCM), which may be in one of two states, which, in the case of chalcogenide glass PCMs, are the amorphous and crystalline phase. The same phases are exploited in optical CD-RW and DVD-RW disk technologies. Commonly-used chalcogenide materials are germanium antimony tellerium (GeSbTe) alloys, usually referred to as "GST", and a specific current commonly-used GST is $Ge_2Sb_2Te_5$, referred to herein as "GST 225".

In one embodiment of this invention, a form of GST is used as the PCM. As used herein, the term "GST" refers generically to a PCM containing at least one of the elements Ge, Sb or Te, and may include compositions of the form $Ge_nSb_mTe_p$, where n,m and p are integers or fractions defining the GST composition, or any binary combinations (e.g., $Ge_nSb_m$, $Sb_mTe_p$, $Ge_nTe_p$), or some GST compositions doped with additional elements (e.g., N). Although GST is used as an illustrative embodiment of the present invention, other PCM can also be used for practicing this invention. Thus, the PCM may comprise other materials, including a completely novel material, which may or may not contain any of the elements Ge, Te, or Sb.

Switching between the states is done by thermal cycling, as shown in the "set" and "reset" processes 100 shown in FIG. 1. Amorphous-to-crystalline conversion involves an anneal below melting point ("Set" process 101), while crystalline-to-amorphous conversion involves melting followed by a fast quench ("Reset" process 102). The READ process exploits the much higher electrical resistivity of the amorphous state. That is, the information state of the memory cell is read by sensing the amount of current flow due to application of a standard voltage.

Current designs of PRAM achieve thermal cycling by joule heating caused by passing current through the PCM. However, for the DRAM application, this method has several disadvantages, including:

1. When the PCM is in the amorphous, high-resistance, state, passing significant current depends on an irreversible electrical breakdown-like conduction phenomenon. The control of this switching process is poor because of the non-linearity of this mechanism.

2. The geometry of the joule-heating based PRAM cell is not optimal for a high performance PRAM.

3. The irreversible conduction approach is only supported by a narrow range of GST compositions.

4. There is no simple scaling law.

Thus, because of these known disadvantages, a need exists for an improved switching memory cell based on phase change (melting/recrystallization) to address at least some of these aspects. Preferably, an improved memory cell would have characteristics, including speed, to be competitive with and even superior to current DRAM.

SUMMARY OF THE INVENTION

In view of the foregoing, and other, exemplary problems, drawbacks, and disadvantages of the conventional systems and techniques, it is an exemplary feature of the present invention to provide an improved PRAM memory cell (and method of fabrication thereof) that is much faster than existing PRAM designs.

It is another exemplary feature of the present invention to provide a technique in which a faster, more efficient, and scalable PRAM memory cell can satisfy requirements in environments not previously realistic for PRAM.

To achieve the above exemplary features and others, in a first exemplary aspect of the present invention, described herein is a structure (and method) for a memory cell including a phase change material (PCM) element and a heating element external to the PCM element. The heating element causes one of a presence of and an absence of a phase boundary within the PCM element for storing information in the PCM element.

In a second exemplary aspect of the present invention, described herein is an apparatus including a non-volatile memory array, including a plurality of memory cells arranged in an array of rows and columns, a word line for each row, the word line connected to each memory cell in the row, a bit line for each column, the bit line connected to each memory cell in the column, and a sense amplifier in each bit line. At least one of the memory cells comprises the PCM memory cell described above.

In a third exemplary aspect of the present invention, described herein is a method of increasing performance in a phase change material (PCM) memory cell, including using a thin surface layer of the PCM as a storage for an information bit.

In a fourth exemplary aspect of the present invention, described herein is a method of forming a non-volatile memory cell, including forming a heating element on a substrate and forming a portion of phase change material (PCM) in close proximity to the heating element, such that the heating element can be controlled to selectively cause one of a presence of and an absence of a phase boundary within the PCM element for storing information in the PCM element.

Thus, the present invention provides improved performance, speed, and size over conventional PRAM devices and presents an advantageous new technology that is very promising as a storage class memory.

Moreover, a high performance PRAM, such as taught by the present invention, is suitable as a local nonvolatile memory embedded in the logic chip environment, e.g., as L3 cache. In this application, following a run interruption, the exact logic state of the system can be restored, enabling seamless continuation of the interrupted task, an advantage not provided by DRAM.

A second exemplary application is in hand-held devices, such as portable computers such as laptops, cell phone, portable audio/video devices, etc., where the nonvolatile and high density properties of PRAM enable it to replace the compact disk, thereby enhancing additional miniaturization of these types of devices for which compactness is highly desired by consumers.

BRIEF DESCRIPTION OF THE DRAWINGS

The foregoing and other exemplary features, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Figure 1:
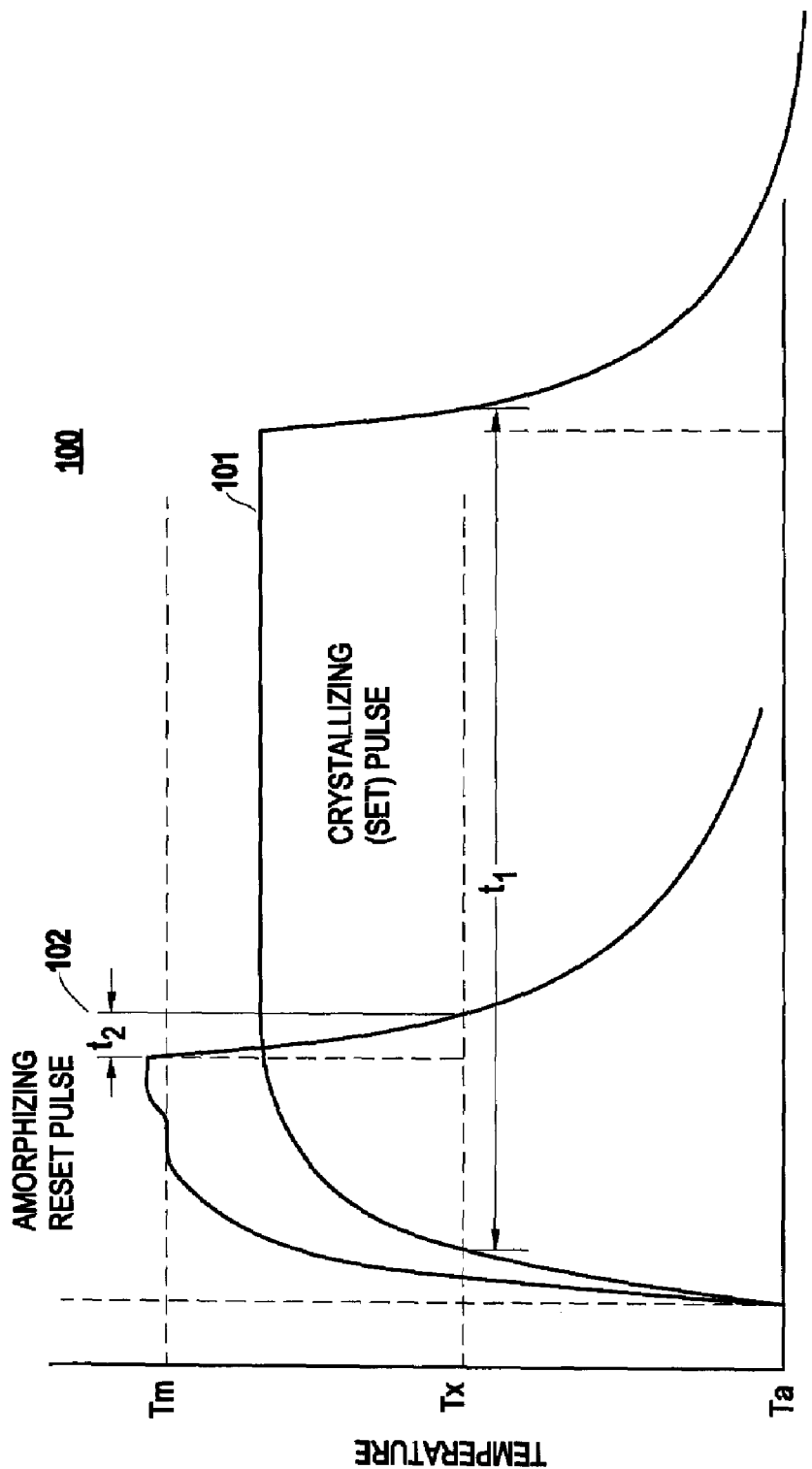
FIG. 1 illustrates the thermal cycling 100 for the set and reset processes of a phase change material as might be used in conventional optical CD-RW disk technology.

Referring now to the drawings, and more particularly to FIG. 2a through FIG. 18, exemplary embodiments of the present invention will now be described.

It is noted that one of ordinary skill in the art, after having read the details described herein, would readily be able to recognize the present invention as a broad concept in which a thin layer (e.g., within a range of about 2 to about 10 nanometers) within a PCM having a larger total thickness (e.g., about 50 nm or more), highly controllable by using an external heating element, provides the mechanism to provide drastic improvement in switching speed for PRAM.

In the context of the present invention, the term "nanoscopic" is intended as meaning a dimension of 100 nm or less. Thus, a concept of the present invention is that an information bit can be stored in only a nanoscopically thin surface layer of a PCM layer that has a thickness relatively larger than the thin surface layer of the that is of the PCM that is used to store the information bit.

That is, the present invention teaches how to fabricate an ultra-fast switching memory cell based on phase change (melting/recrystallization) in an appropriate material. This device is competitive with DRAM, in contrast to the device described in co-pending U.S. patent application Ser. No. 10/401,564, filed on Mar. 31, 2003, to Hendrik F. Hamann et al., entitled "THERMAL MEMORY CELL AND MEMORY DEVICE INCLUDING THE THERMAL MEMORY CELL", where a relatively slow 100 ns time scale is described for that PCM memory mechanism that also uses a heating element external to the phase change material. The device described in this co-pending Application, is hereinafter referred to simply as the "precedent PRAM device".

A key challenge to achieve high speed in a PRAM device is to keep heat propagation and melt front propagation distances in the nanometer range, without involving costly nanofabrication technology. This is accomplished by one or more of the following distinguishing elements of the present invention relative to the precedent PRAM device described in the above-mentioned precedent device.

First, the short distances, recognized by the present inventors as being an important parameter for improvement over conventional PRAM designs, are defined as normal to the plane of a thin film, which is deposited by conventional means. Hence, the short distance constraint is also achieved within an easily manufacturable process.

Second, being the information storage region and depending upon which of the two information states are stored, the phase change material (PCM) film has a "phase boundary" interface between a crystalline part, taking up the part of the film thickness remote from the heating element, and the active, transformable part, close to the heater interface. As has been shown in simulations of the recrystallization process, this design avoids the very slow process of nucleation.

In the design of the present invention, recrystallization propagates very rapidly as a flat front from the amorphous/crystalline interface. Without such an interface, which is not present in either the precedent PRAM device or conventional PRAM devices, the high speed of the PRAM cell of the present invention cannot be achieved.

Third, the prescription for the applied power and length of power application is another non-obvious parameter that also is not present in the precedent PRAM device.

Fourth, in at least one of the exemplary embodiments discussed herein, the present invention teaches the use of diodes, both pn junction and Schottky, as integrated heating/switching elements, thus potentially enabling higher areal density competitive with DRAM. The use of active diode heater elements leads to heat production linear in the current, thereby facilitating the use of small currents. This integrated heater/switch concept is a fully novel idea not presented in the precedent PRAM device or any conventional systems known to the inventors.

Fifth, the method of the present invention leads to a simple scaling of the device performance to smaller areal dimensions.

Sixth, the present invention teaches a read and write scheme based simply on reversing current (read and write depends on current polarity) with explicit circuit networks for the memory matrix to accomplish this. This also is a fully novel idea not presented in the precedent PRAM device or any known conventional system.

Hereinbelow is described a novel GST-based PRAM memory cell using thin film geometry. The PCM is in the form of a film, of which only a thin transformable surface layer (e.g., of order of 10 nm or less in thickness, and typically around 5 nm thickness in the prototypes to date) actually undergoes phase change to define the information bit being stored in that memory cell, the rest remaining in the crystalline state. The heater is external to the PCM and preferably located adjacent to the transformable PCM surface.

There are numerous advantages of this design, including:
1. Control of the switching process is precise.
2. Heat conduction across the 5 nm transformable layer is very fast, due to the small dimension.
3. The melt front propagation is very fast for the same reason.
4. Recrystallization occurs by advance of the amorphous/crystalline interface, and does not depend on the slow nucleation process. Crystallization front propagation is also very fast because of the small dimension.
5. The design is flexible regarding PCM composition.
6. The planar geometry leads to understandable scaling.
7. The small amount of heated PCM leads to limited power requirements.
8. The small amount of phase-changed PCM leads to limited dimensional changes, aiding device lifetime.

In the thin-film design of the exemplary embodiments, the read current is typically passed normal to the plane of the film. Some form of switching (e.g. diodes, etc.) is required in order to separate the read current from the write (heater) current.

The external heater adjacent to the transformable PCM layer can take several forms. In addition to an external resistive heating element, a p-n junction diode or a Schottky diode external element can also be used. In the diode case, it is then also possible to combine the heating and switching functions of the diode.

Along this line, recently-filed co-pending U.S. patent application Ser. No. 11/123,086, filed on May 6, 2005, to Krusin-Elbaum et al., entitled "METHOD AND STRUCTURE FOR PELTIER-CONTROLLED PHASE CHANGE MEMORY," describes a memory cell somewhat similar in some aspects to the present invention, but differing in that its heater element comprises a Peltier element that provides the further capability for cooling the PCM layer, in addition to its role as an external heating element. In this sense, the second co-pending Application becomes another embodiment of the general concepts described herein, with the non-obvious additional feature of a cooling capability for the heating element.

Description and Function of a Single Cell

Figure 2A:
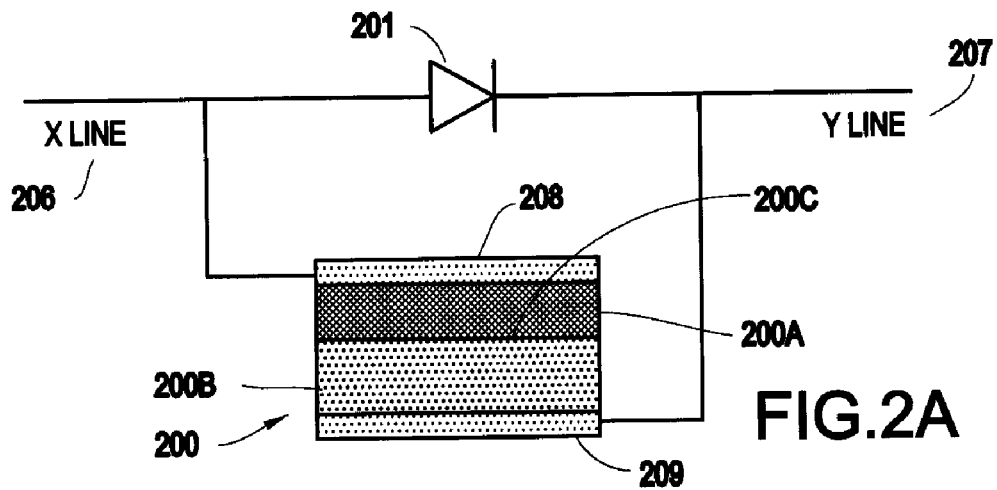
FIGS. 2a–2c exemplarily illustrates three variations of memory cell units in which basic the PCM element 200 has a different external heater element or control of current.
Figure 2B:
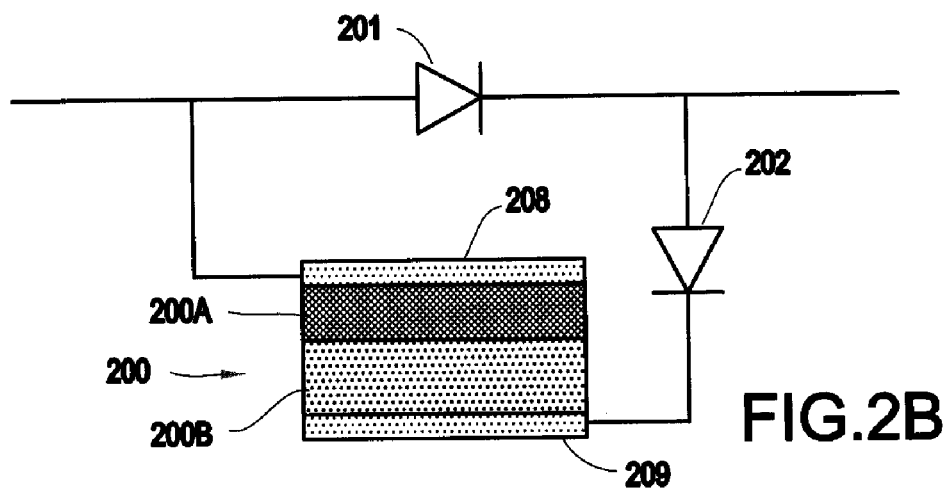
Figure 2C:
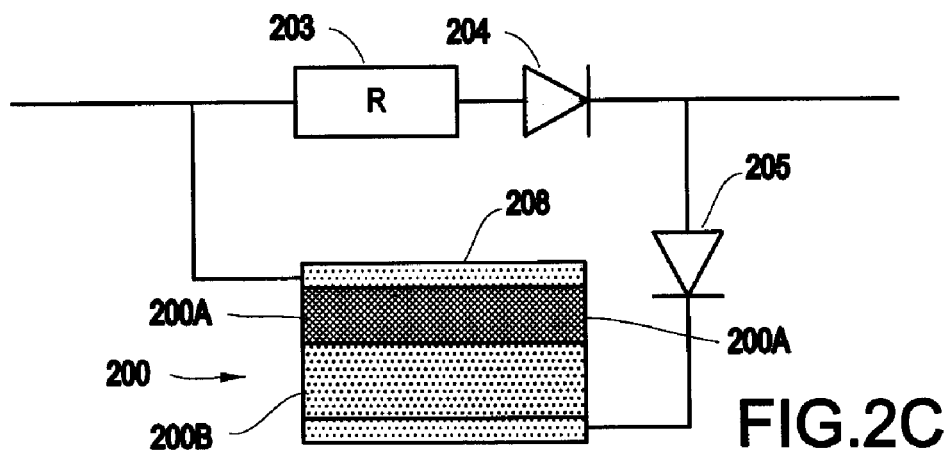

FIGS. 2a through 2c illustrate exemplary circuit diagrams of several configurations of a single memory cell that utilize the exemplary basic structure of the present invention. FIG. 2a and FIG. 2b show cells using a diode 201 as the heating element, while FIG. 2c shows a cell with resistor 203 for the heat source. In FIGS. 2a and 2b, the diode heater 201 also functions as a switch, while in FIG. 2c two diodes 204, 205, additional to the resistive heater 202, form a switching mechanism.

In FIG. 2a, two circuit elements, the combined diode heater/switch 201, and the GST PCM device, are connected in parallel across the intersecting address lines 206,207, also exemplarily termed the "X line" and the "Y line", since a memory array based on memory cells of the present invention will have X and Y coordinates. The diode 201 is in physical proximity to the GST element 200, so as to act as an external heater for it. Electrode elements 208, 209 allow the resistance of the GST element to be measured to determine which information bit state is currently represented in the memory array cell.

In FIG. 2b, there is an additional diode switch 202.

In FIG. 2c, the diode heater 201 in FIG. 2b is replaced by a resistive heating element 203.

It is noted that the GST element 200 includes a transformable region 200A and crystalline region 200B. Transformable region 200A is the region that is converted by the heating element to be either the amorphous state or the crystalline state for storage of an information bit. The interface 200C between the transformable region 200A and the crystalline region 200B is also referred to as a phase boundary. However, it is noted that this phase boundary 200C will actually be physically present as a physical boundary between the amorphous/crystalline states only during one of the two information bit states.

However, it is noted that the present invention is more general than a physical boundary between a/c and may be generally a physical boundary between two states of the pCm That is, in the exemplary embodiment shown, in one of the two information states, the transformable region 200A has the same crystalline structure as the crystalline region 200B and there is no phase boundary 200C that delineates the transformable region 200A from the crystalline region 200B. In the other information state, the transformable region 200A is changed into the amorphous state, thereby creating the phase boundary 200C separating the crystalline region 200B and the amorphous state of the transformable region 200A during this information bit setting.

As will become apparent, the thickness of the transformable region 200 represents a design tradeoff between speed and the differentiation between the two information bit states. Thus, since the two information states will be represented by whether the transformable GST region 200A contains amorphous or crystalline states, distinguished by measuring the resistance across the electrodes 208, 209, the greater the thickness of this transformable GST layer 200A, the more distinct will be the difference in the two resistance values representing the 0 and 1 information states.

On the other hand, greater thickness of the transformable GST layer 200A requires that the heating process used to set the information states will take longer, thereby affecting speed. As a practical matter, for the scale of size of the memory cells of the prototype, the transformable GST layer 200A is less than 10 nm and preferably approximately 5 nm. However, the thickness of the transformable GST layer, or PCM in general, may lie outside this range with other materials or modified design parameters.

Figure 3:
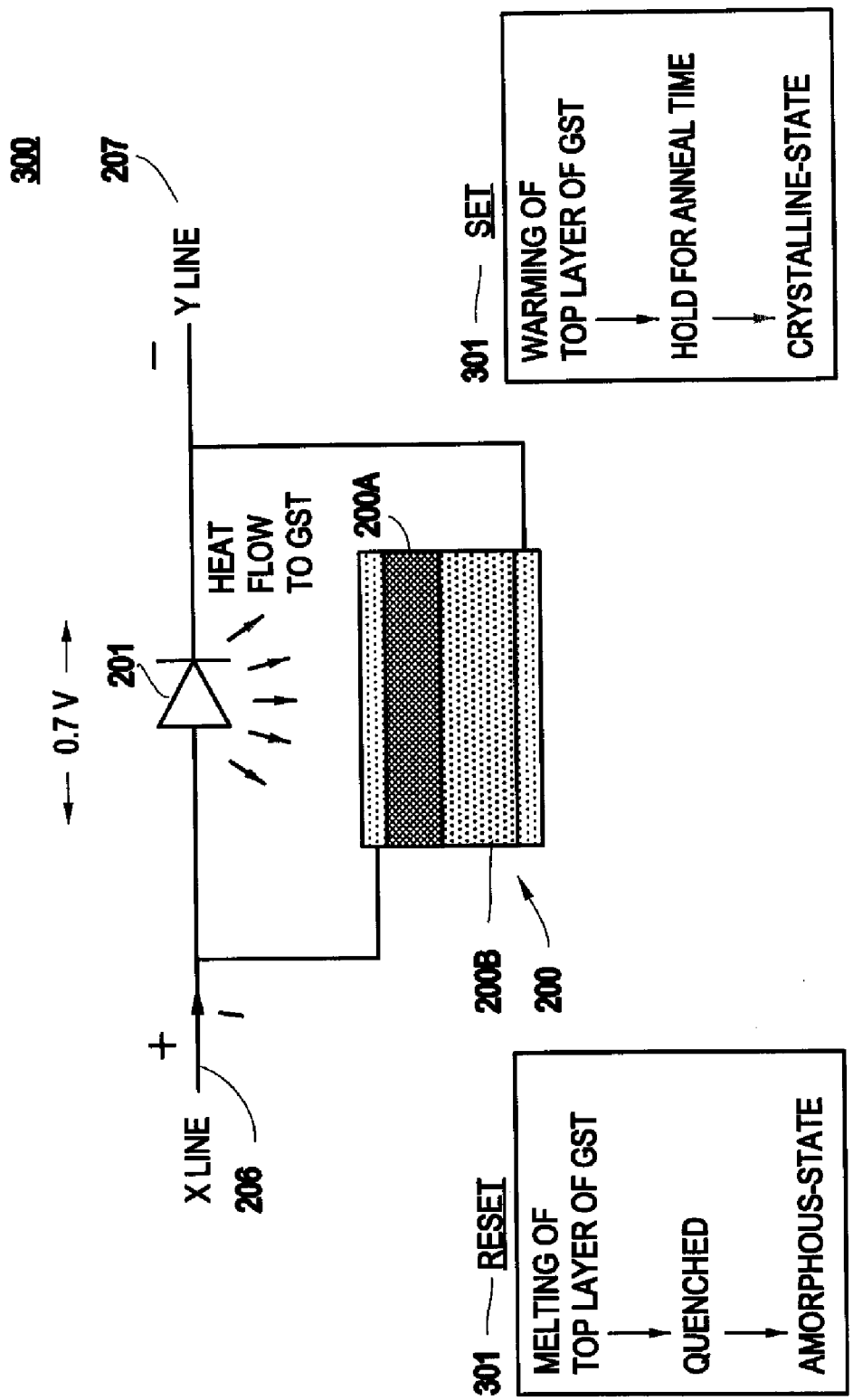
FIG. 3 illustrates the WRITE process 300.
Figure 4:
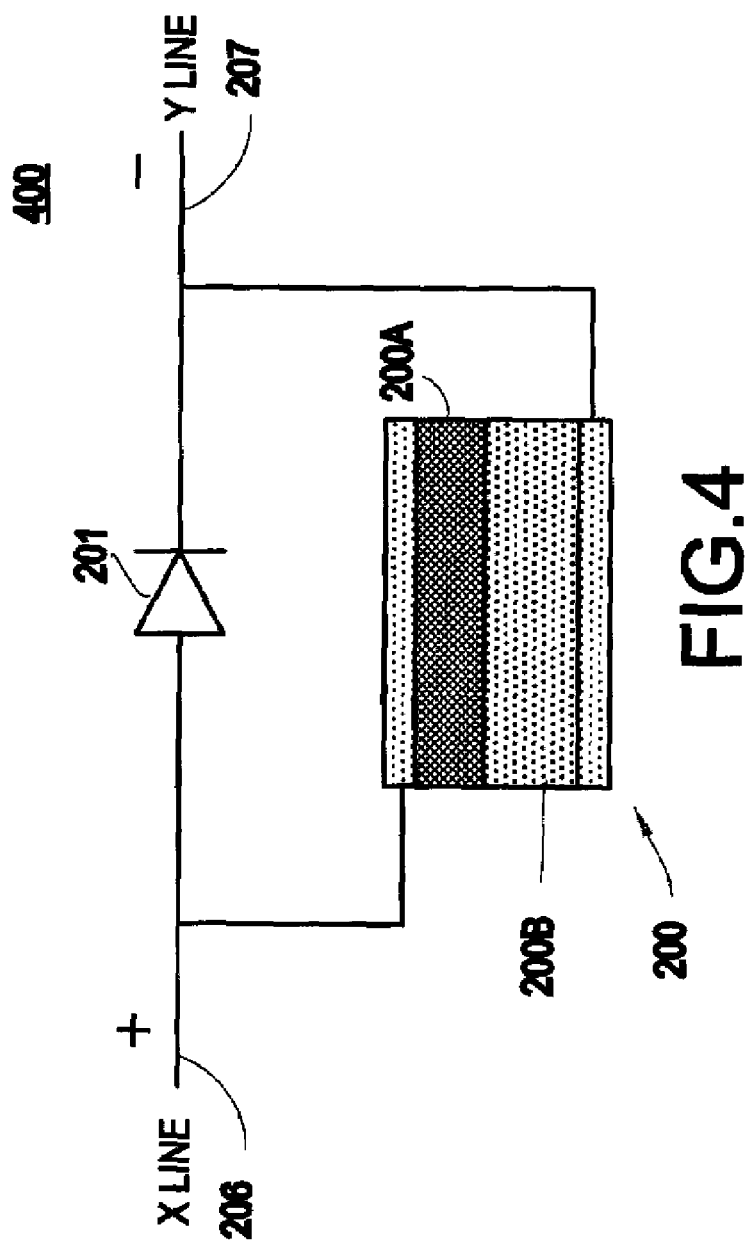
FIG. 4 illustrates the READ process 400.

The functioning of the memory element in FIG. 2a is shown in FIGS. 3 and 4.

In the WRITE step 300 shown in FIG. 3, the polarity of the external lines 206, 207 allows forward current in the diode 201 (e.g., at an exemplary voltage drop of approximately 0.7V). The resistance of the GST memory (e.g., assuming a composition such as GST 225 for the GST element 200) is such that current flowing through the GST 200 during write is only about $\frac{1}{10}$–$\frac{1}{5}$ of the heater current, giving rise to negligible intra-GST joule heating. Heating of the element 200 is instead via the joule heat generated within the diode 201.

In the crystalline-to-amorphous (RESET) process 301, after reaching the peak temperature, sufficient to melt a thin layer 200A at the GST surface, the current is turned off to allow a fast quench of the GST surface to the amorphous phase. In the amorphous-to-crystalline conversion (SET process 302), heating to a lower temperature, held for a somewhat longer time to permit anneal to the crystalline phase (SET process) is implemented.

In the READ step 400 shown in FIG. 4, the reverse polarity is applied from the external lines 206,207, thus cutting the diode 201, which is now in reverse bias, out of the circuit. Now only the impedance of the GST element 200 appears across the external lines 206, 207. An impedance of the order of, for example, 10 KΩ is sensed for the crystalline state, and a very high resistance (e.g., of the order, for example, 10 MΩ) is sensed for the amorphous state (e.g., values for 225 composition), since the thin amorphous film 200A forms a series component in the circuit.

In the variant FIG. 2b, a second diode 202 is introduced. In the write process, all current through the GST element is blocked by diode 202, enabling a lower resistance (e.g., approximately 1 KΩ) GST element 200 to be used, which also provides the advantage of providing a faster RC time constant for switching states. The read process works exactly as for the single diode circuit shown in FIG. 2a.

In the variant of FIG. 2c, the diodes 204, 205 are separate from the extrinsic resistive heating element 203, which forms a fourth component in the circuit. This has advantages in terms of physical implementation, as will be discussed in the next section. Otherwise, function of the circuit in FIG. 2c is essentially the same as in the foregoing cases.

Physical Implementation and Materials Aspects

Figure 5:
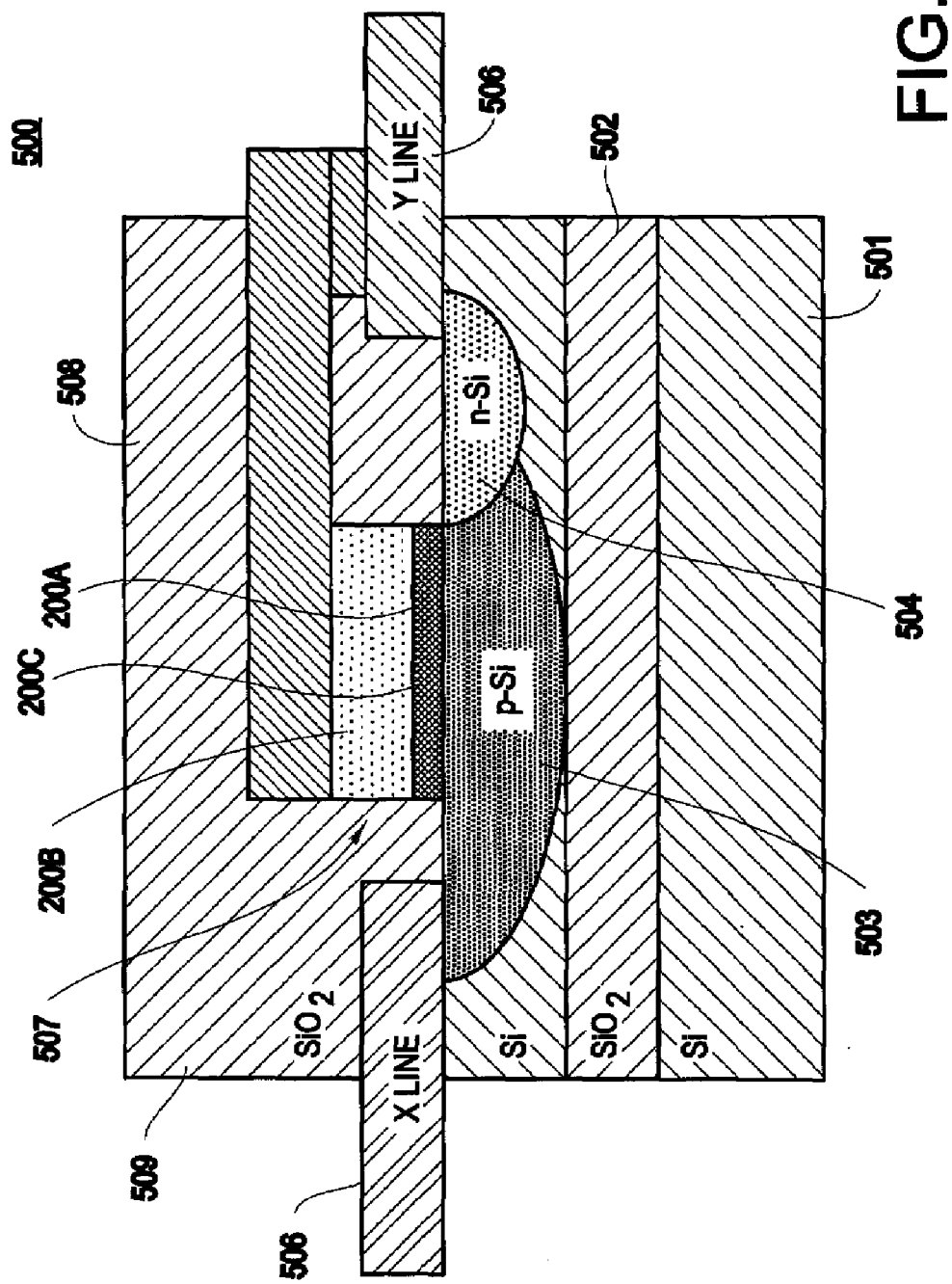
FIG. 5 shows a cross section 500 of a memory cell having a pn diode heater.
Figure 6:
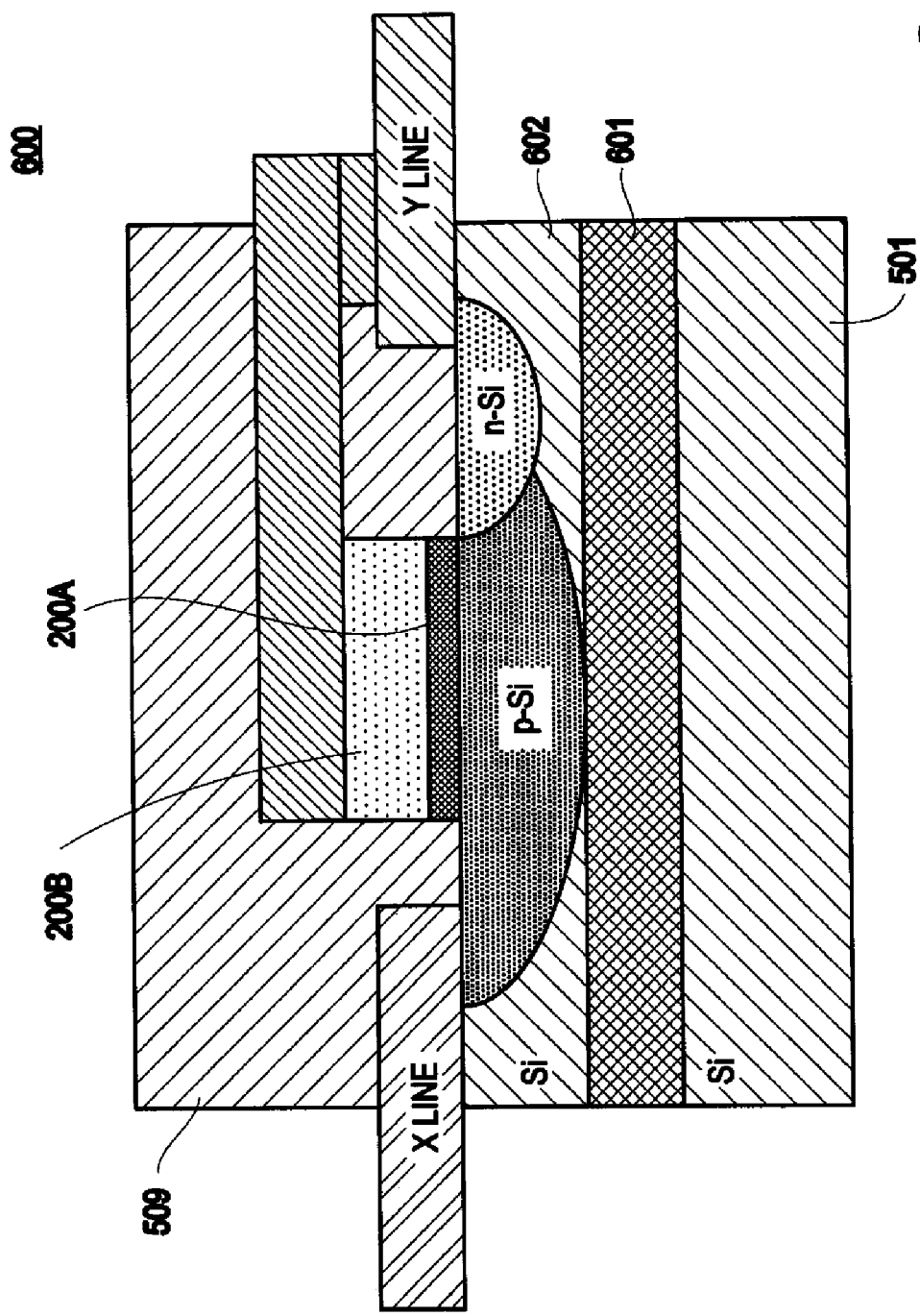
FIG. 6 shows a cross section 600 of a memory cell having the heater embedded in a thermal insulative layer 601.

FIGS. 5 and 6 demonstrate possible physical implementations 500, 600 of the basic circuit in FIG. 2a.

In FIG. 5, starting with a Si substrate 501, oxygen ion implantation followed by annealing is used to create an SOI structure of crystalline Si on an insulating substrate 502. The insulating layer 502 is a preferred structure in this exemplary configuration to prevent excessive heat loss from the heater into the silicon substrate 501.

Dopant ion implantation, followed by annealing, is used to create overlapping p- and n-regions 503, 504 constituting a pn junction diode. Metal contacts 505, 506 to the p and n regions are then formed. These contacts may be made from an electrically conducting, but thermally insulating, material such as TiN.

A GST section 507 is then deposited onto the p-region having a thickness in the range of approximately 40–100 nm. As previously described, the surface 200A of this GST layer 507 closest to the heating element will be transformable for information bit storage, providing, in effect, the presence or absence of a phase boundary 200C with the crystalline portion 200B of the GST layer 507.

It is noted that, in the non-limiting examples of the present invention, because of the relationship between the heating element and the GST deposited as a layer, the transformable region 200A assumes the form of a "quasi-planar" region of the GST layer 507, meaning that the information bit is stored in a region that is substantially planar in nature, and has a thickness in the neighborhood of 2–10 nm, in the scale of memory cell size used for current prototypes. In this embodiment, the interface between the transformable region 200A and the crystalline portion 200B corresponds to a quasi-planar, or substantially planar, phase boundary. It is also noted that, as the scale of the memory cell decreases, the thickness of the GST layer 507 and the transformable layer may proportionally decrease.

Preferably, the GST/Si interface should be substantially unperturbed by the brief (ns) heating cycles to 600–700 C, to within a few angstrom. Therefore, if necessary, an interfacial reaction can be prevented by the use of a very thin conducting (~5 nm.) barrier layer (not shown in FIG. 5) between the silicon 503 and GST layer 507, for which many materials may serve, and their conduction requirements should be tailored to GST composition.

Finally, a metal 508 contact to the top surface of the GST 507 is extended to contact the metal contact with the n region 504. The p-region contact 505 is then connected to the X-line, and the n-region contact 508 is connected to the Y-line. Insulator layer 509 completes the structure.

In an alternate configuration 600 shown in FIG. 6, on top of the Si substrate, a thermally and electrically insulating (e.g., low K, low σ) epitaxial layer 601 is deposited. The thermal conductivity should lie in the range of 0.01–0.02 J/(K cm sec) or below, and the material should be temperature-stable in the device operating range. This layer should be crystalline and be able to serve as a substrate for the deposition of good-quality crystalline silicon. One possible embodiment is the epitaxial deposition of ~50 nm thick perovskite material such as yttrium-stabilized zirconia (YSZ), $BaNd_2Ti_3O_{10}$(BNT), or $xGdO_{1.5}\cdot(1-x)ZrO_2$.

The processes for epitaxial deposition of such layers are well known. The silicon 602 forming the diode heater/switch is then epitaxially deposited on top of this crystalline thermal blanket. The remainder of the device is fabricated similarly as in FIG. 5.

Figure 7:
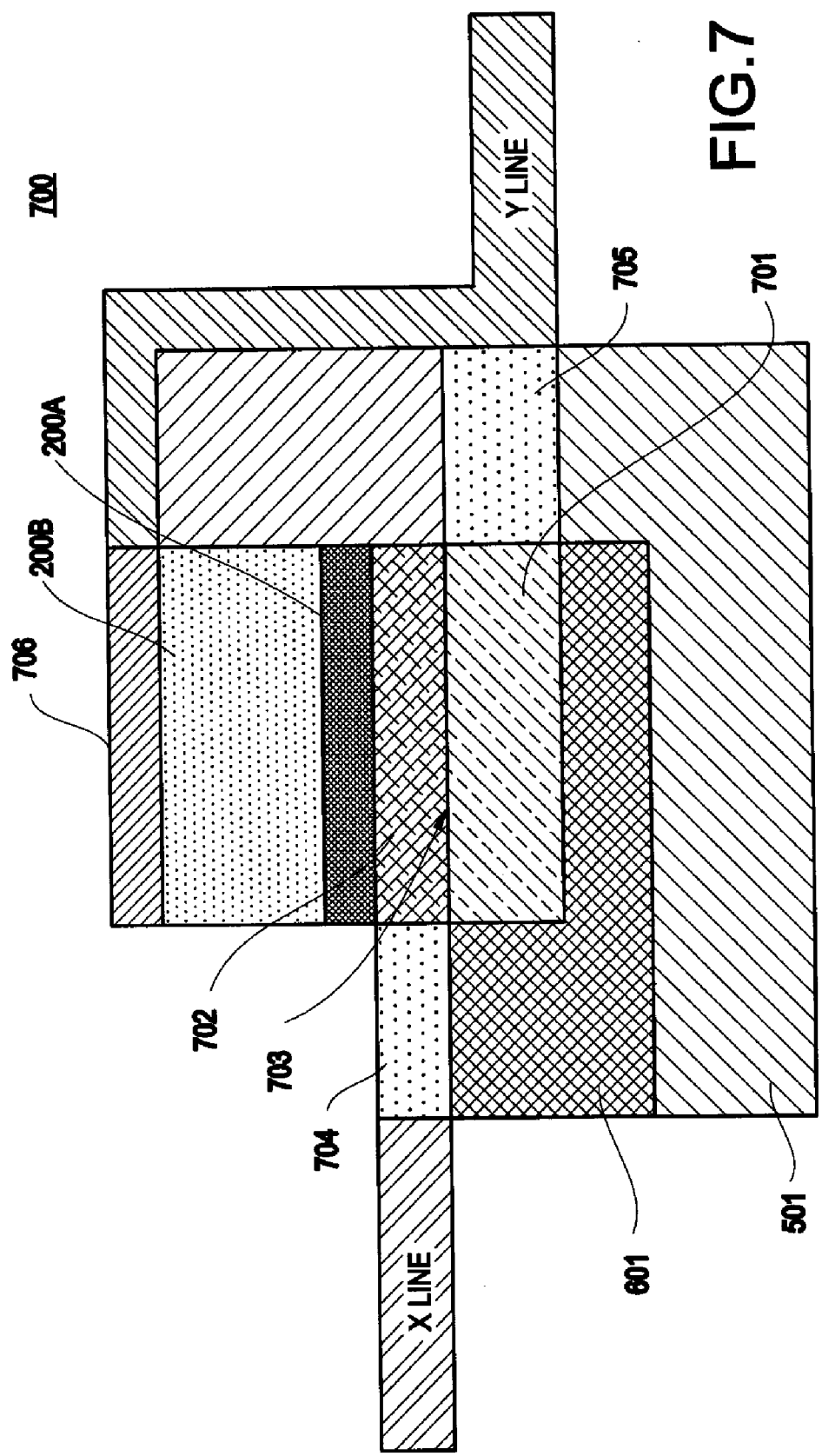
FIG. 7 shows a cross section 700 of a memory cell having a Schottky diode as the heater element.

In an alternative embodiment 700 shown in FIG. 7, only n-type doped Si 701 is deposited, followed by a refractory metal 702 forming a Schottky diode 703 with the Si 701. Contacts 704, 705 are made with the n-layer of Si 701 and with the Schottky diode anode 702 using a low K, high σ material such as TiN. The upper electrode connecting the GST crystalline 200B to the Y line can then be formed by depositing a conductive material 706.

Figure 8:
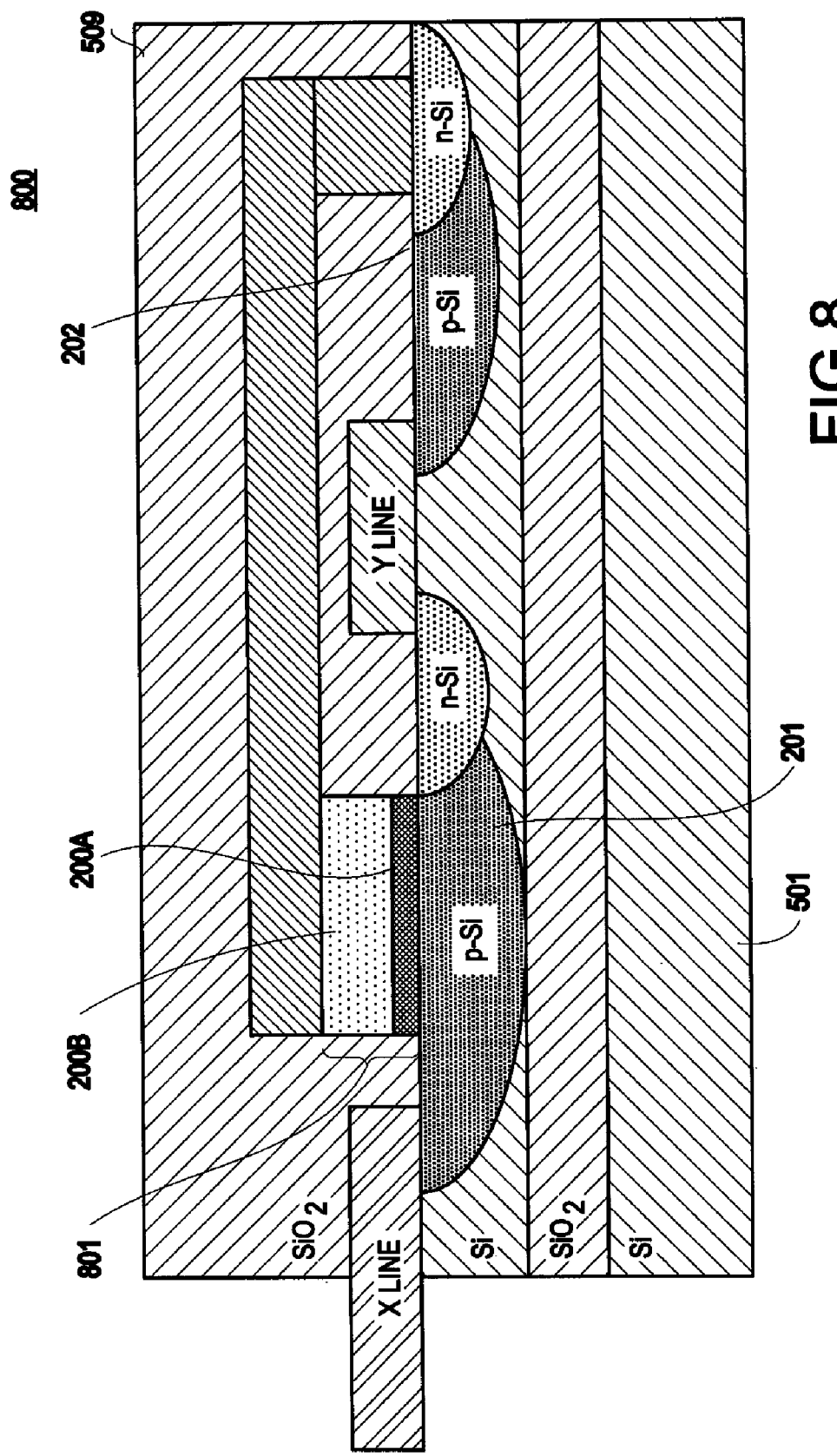
FIG. 8 shows a cross section 800 of the circuit exemplarily shown in FIG. 2b having a second diode 202 for current control.

FIG. 8 similarly sketches an exemplary cross section 800 of the circuit of FIG. 2b, in which the second diode 202, is fabricated in the same processing step as diode 201, with the additional metal contacts sketched in the figure. The GST film 801 is desired to have a lower electrical resistance than that in the single diode case, which may be accomplished by a smaller thickness, by tailoring the GST composition, or by suitable doping (e.g. lowering nitrogen doping decreases GST resistivity). In an alternative embodiment, since the second diode 202, does not require thermal insulation, this second diode 202 could be fabricated in the silicon substrate, as for both diodes 204, 205 in FIG. 9.

Figure 9:
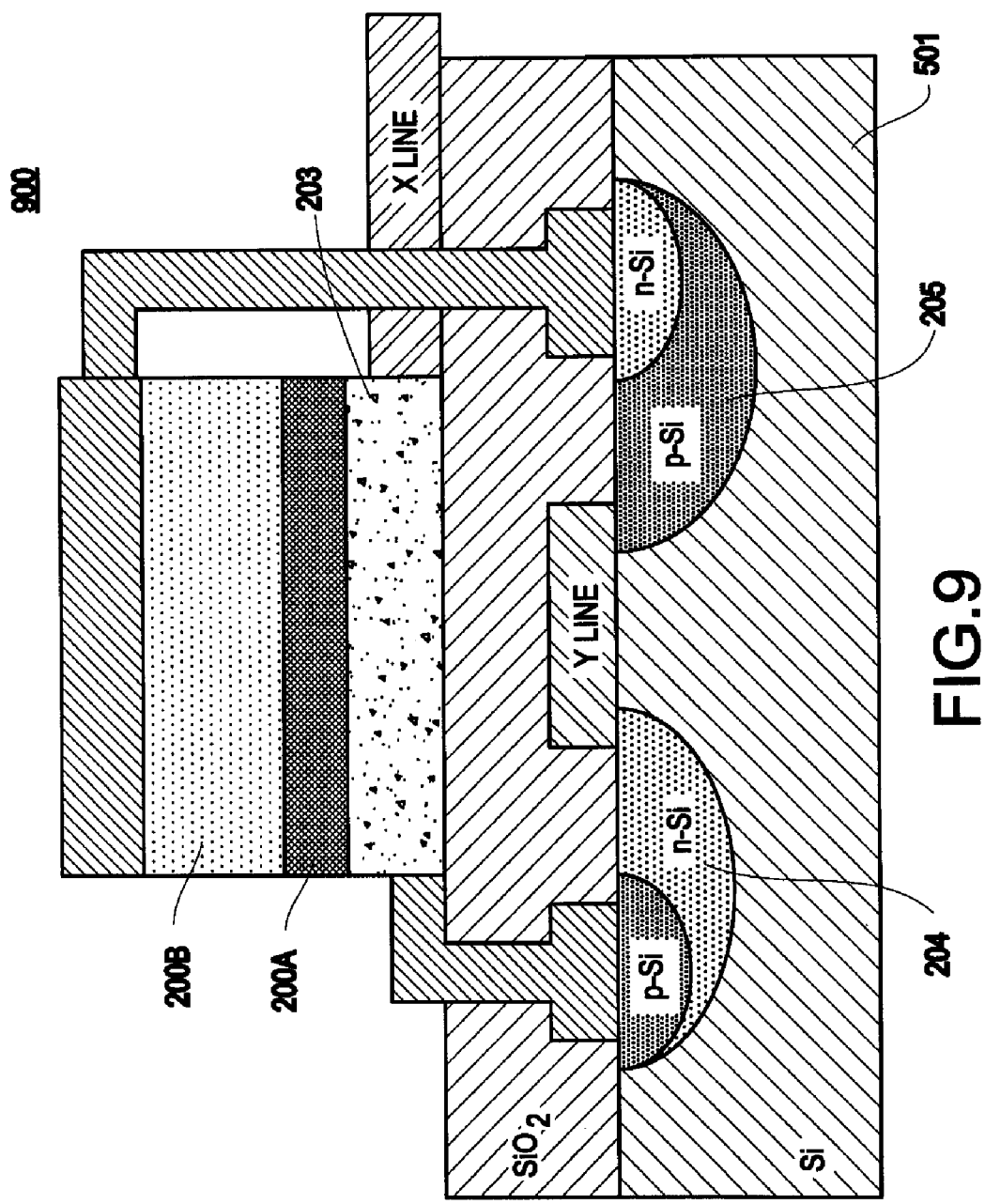
FIG. 9 shows a cross section 900 of the circuit exemplarily shown in FIG. 2c having a resistive heater element.

In FIG. 9, an exemplary cross section 900 of the circuit of FIG. 2c, having resistive heating, is illustrated. In this case, both diodes 204, 205 may be fabricated in the silicon substrate 501, since neither one requires thermal insulation.

With an electrical conductivity of $\sigma=10$ Ohm$^{-1}$ cm$^{-1}$ (Table I), the 225 crystalline material would require a thickness of only 15 nm for a resistance of 1 KΩ, and 150 nm for a resistance of 10 KΩ. The resistive heater 203 is exemplarily made of a thin layer (e.g., within a range of from about 10 nm to about 30 nm) of low K, moderate σ material, such as TaSiN. The thickness of this material is significant, since its heat capacity will be too high and thermal conductance will be too low if the thickness is excessive. TaSiN is exemplarily chosen in this discussion because of its refractory nature, nonreactivity with GST, fairly high resistivity, and reasonable thermal conductivity, but other materials could be used that have similar characteristics in these traits.

Technical Estimates of Cell Performance

The following model is used only for illustrative purposes, since the broader concepts of the present invention are not necessarily dependent upon the specific values used in this model. The analysis below applies to any of the circuits in FIGS. 2a–c. For definiteness and focus, a GST material with the properties approximating those of the 225 material $Ge_2Sb_2Te_5$, and a thin film diode-type silicon heater are assumed.

The 1-D Heat Model

Figure 10:
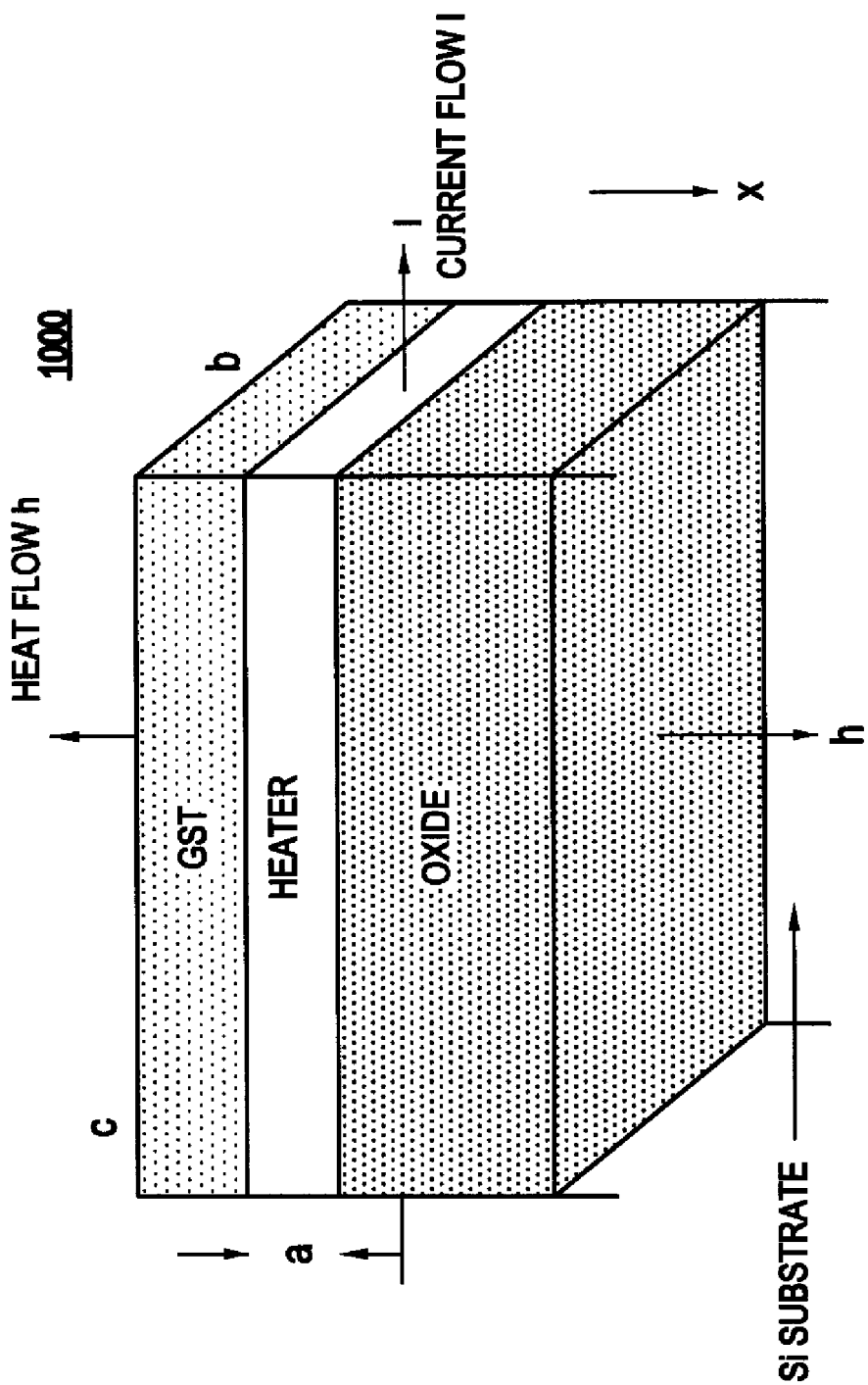
FIG. 10 shows the exemplary slab geometry 1000 for a heat flow model of the memory cell.

The notation for the physical dimensions is shown in FIG. 10. Materials parameters are listed in Table I for $Ge_2Sb_2Te_5$, although the design remains functional with a different composition GST material (e.g. $Ge_xSb_{1-x}$), provided the design parameters are tailored accordingly.

TABLE I

Specific Heat $C_p$, Thermal Conductivity K, electrical conductivity σ

| Phase | GST Cryst. | GST Amorph. | Oxide | Si |
|---|---|---|---|---|
| $C_p(J/(Kcm^3))$ | 1.3 | 1.3 | 3[++] | 1.6 |
| $K(J/(Kcmsec))$* | 0.005 | 0.0017 | 0.013[++] | 0.8[+] |
| σ $(Ohm^{-1}cm^{-1})$ | 100** | 0.001** | — | |

*Dependent on source
**Controllable by N-doping.
[+]Average over T
[++]Typ.

The heat flow model is based on slab geometry 1000 shown in FIG. 10, which has the property that, if the parameters satisfy bc several times 2a(b+c), then, for a uniform oxide coating, most heat flows out of the bottom surface of the Si diode structure. GST is a poor thermal conductor (Table I), the key conductivity-heat capacity product for GST is of order 0.1 times that of typical oxide. Hence, as a first approximation, the heat loss through the upper GST interface of the heater can be ignored.

In the case of a Si heater, despite the non-uniformity of the heat source, because of the excellent thermal conductivity of Si (Table I), for devices at or under 100 nm lateral dimension, the temperature is considered to be uniform, with value T(t), within the Si. For a resistive heater, the heat source itself is uniform, maintaining a uniform temperature profile in the xy plane for this reason, though there is not a completely uniform temperature normal to the plane.

In the following, it will be seen that, except for a short-time transient, the heater parameters approximately disappear from the problem. Hence, only the heat per unit area provided is the key quantity. Since conduction through the TiN leads may still be significant, the design should aim to minimize this heat loss in order to maintain as far as possible a temperature distribution which is a function of x (distance normal to slab) only. In the exemplary embodiment, this effect is achieved in part by keeping the dimensions of the leads small, but other more complex design fixes exist. Since any mechanism that approximates this basic heat loss model is appropriate, the specific design details are not particularly significant for the present discussion.

Solution of Heat Diffusion Equation for 1D Model

With these explanations, the heat flow model is then a single-sided 1D one, in which temperature is considered as a function of x and time t. The temperature distribution within the oxide is denoted as $\Phi(x,t)$. Within the oxide the heat diffusion equation applies $$\frac{\partial \Phi}{\partial t} = D\frac{\partial^2 \Phi}{\partial x^2}; \quad D = \frac{K_{ox}}{C_{ox}},.$$

where $K_{ox}$, $C_{ox}$ are the oxide thermal conductivity and volumetric specific heat, respectively.

Within Si, heat balance leads to the equation $$\frac{dT}{dt} = \frac{1}{aAC_s}\left[W_0 + AK_{ox}\frac{\partial \Phi}{\partial x}\bigg|_{x=0}\right],$$

where A=bc is the cross-sectional area, $C_S$ is the specific heat of Si, $W_0=V_t I$ ($V_t$, I being diode threshold voltage and current) is the rate of heat production in the diode, while the second term on the right is the rate of heat flow out of the Si into the oxide.

Finally, the Si temperature equals that at the oxide surface $$\Phi(0,t)=T(t).$$

The linear equations are solved by the Laplace transform technique. Starting from cold oxide, the result for the silicon temperature T can be written $$T = T_1 + T_2,$$

where $$T_1 = T_0 e^{\alpha t}(1 - \text{erf}(\sqrt{\alpha t})),$$

and $$T_2 = \frac{w}{\alpha}[e^{\alpha t}(1 - \text{erf}(\sqrt{\alpha t})) - 1] + 2w\sqrt{\frac{t}{\pi\alpha}}.$$

Here, $T_0$ is the initial temperature of the Si relative to outside temperature, $w=W_0/(aAC_S)$, and $\alpha=K_{ox}C_{ox}/(aC_S)^2$ is a characteristic thermal relaxation rate. For long times relative to $\alpha^{-1}$, there are simple, very useful, asymptotic approximations $$T_1 \simeq \frac{T_0}{\sqrt{\pi\alpha t}}; \quad T_2 \simeq 2w\sqrt{\frac{t}{\pi\alpha}} = 2\left[\frac{W_0}{A}\right]\sqrt{\frac{t}{\pi K_{ox}C_{ox}}}.$$

Figure 11:
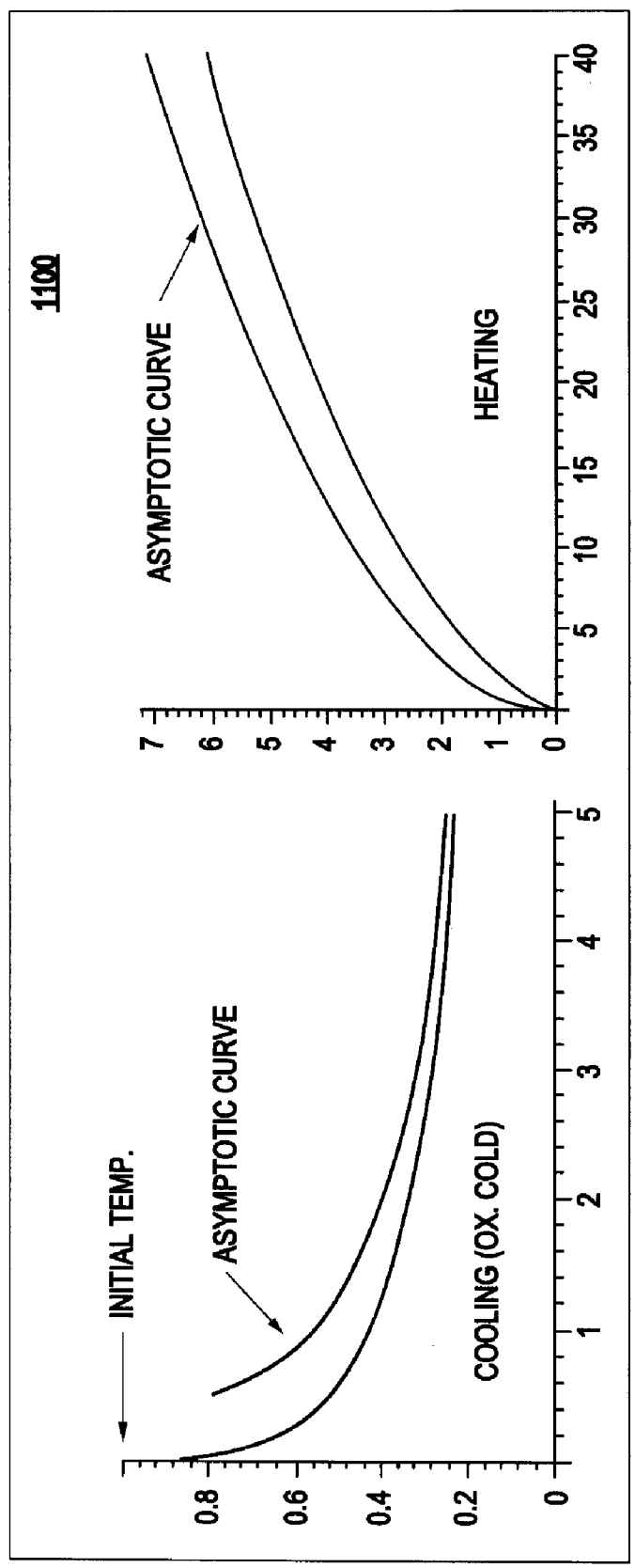
FIG. 11 shows the cooling and heating curves 1100 resulting from the heat flow model.

These expressions, for cooling starting from a given initial Si temperature, with oxide cold, and for heating with zero relative initial temperature, along with the asymptotic approximations, are illustrated in the cooling and heating curves 1100 shown in FIG. 11 for dimensionless units $\alpha=T_0=w=1$.

It is noted that, in cooling with the oxide initially cold, there is an immediate very rapid temperature drop, after which the slow asymptotic approximation takes over. In heating, the curve follows the asymptotic approximation quite well throughout. The time constant $\alpha^{-1}$ is, in practice, very short, e.g. 0.25 ns for a 20 nm Si film. Hence, it can be deduced from the results in FIG. 11 that the transient with time constant $\alpha^{-1}$ can approximately be neglected, allowing one the simplification of working in the asymptotic long-time approximation.

Figure 12:
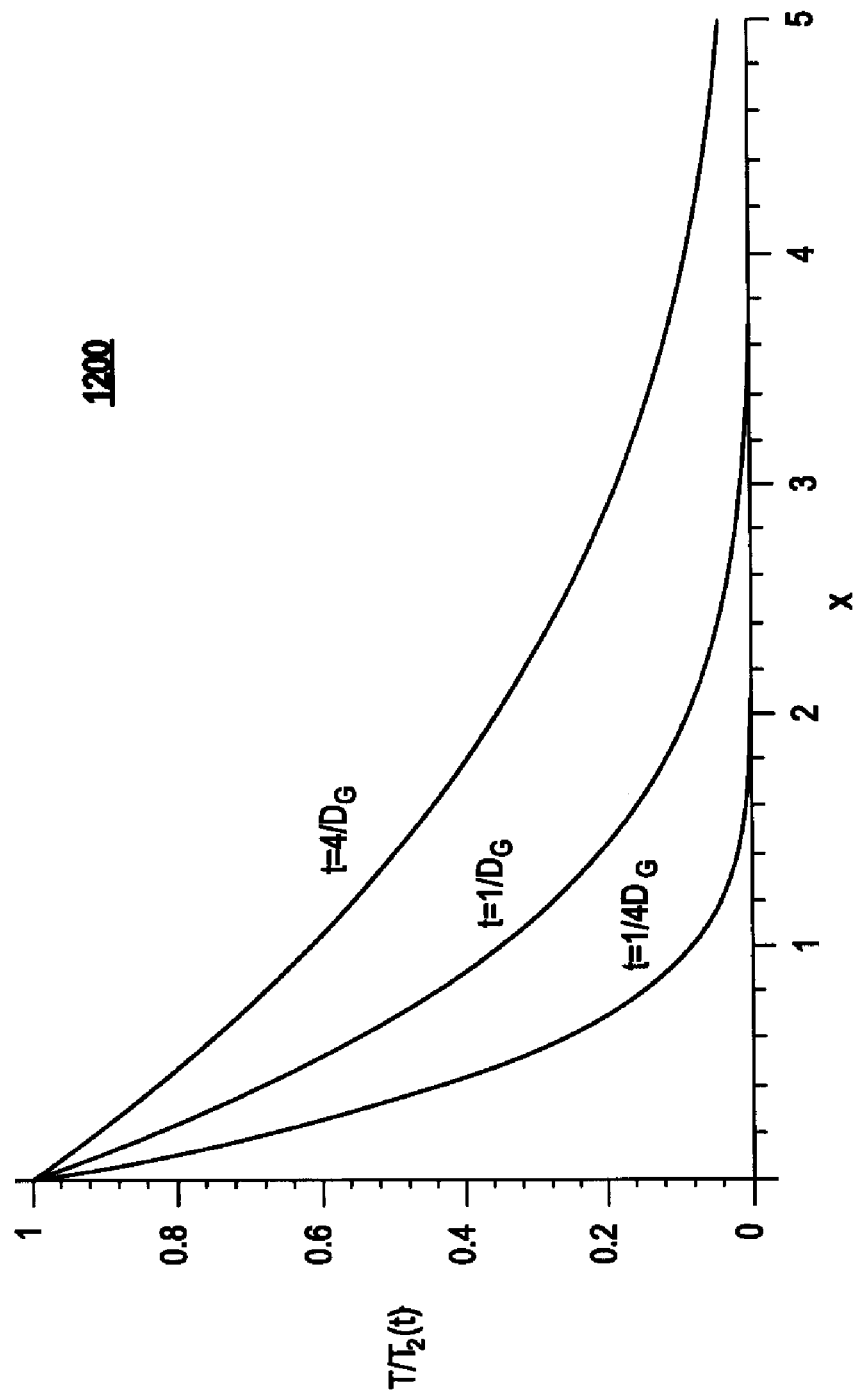
FIG. 12 shows the heat penetration curves 1200 resulting from the heat flow model.

In the heating process, neglecting latent heat of melting (considered in the following numerical treatment), the heat profile in the GST is given by $$\Phi(x,t) = T_2(t)[e^{-z^2} - z\sqrt{\pi}(1-erf(z))],$$

where $z = x/\sqrt{4D_G t}$, $D_G = K_G/C_G$ is the diffusion constant for GST, and $K_G$ is the GST phase-averaged thermal conductivity. This equation is plotted in the curves 1200 in FIG. 12 showing the penetration of the heat pulse into the PCM.

The cooling cycle is easy to implement in the Laplace transform method, by just applying the heating pulse shifted to a switch-off time $t^{off}$ with negative sign, and apply the shift theorem. Some results are illustrated in the GST cooling cycle curves 1300 shown in FIG. 13. These curves show the same kind of temperature-time dependence as that specified in FIG. 1.

Some numbers are collected in Table II. Here, "$t_{600}$ (0)" is the time for the Si temperature to reach 600 C, and "$t_{600}$ (5)" is the time for a layer 5 nm. inside the GST surface to reach 600 C. The diode forward voltage drop is being taken as $V_f = 0.7$ V, and "$\tau_{cryst}$" is the time for the crystallization front to cross 5 nm.

TABLE II

Inputs and Results

| Inputs | | | | |
|---|---|---|---|---|
| a(nm) | b(nm) | c(nm) | $T_0$(C) | I(mA) |
| 10 | 100 | 150 | 600 | 0.5 |

| Results | | | |
|---|---|---|---|
| $\alpha^{-1}$(ns) | $t_{600}$(0)(ns) | $t_{600}$(5)(ns)* | $\tau_{cryst}$(ns)** |
| 0.06 | 2.1 | 2.7 | 2 |

*Using average value $K_G = 0.003$.
**For $v_{cryst} = 2$ m/sec.

There is a very fast time constant $\alpha^{-1}$, which is the time constant of the silicon-relevant transient, and is also the time before the asymptotic approximation sets in. For longer times than $\alpha^{-1}$, the silicon temperature evolves according to power law behavior and is controlled by heat diffusion in the oxide. For the long-time behavior, characteristic times in the 2–3 ns range are seen to occur.

Amorphization (RESET) involves heating a thin layer (e.g., from about 2–10 nm) near the surface of the GST to the melting temperature. The times in the table are for the silicon to reach 600K (which is of order the melting temperature) and for the point x=5 nm. inside the GST to reach 600K.

Figure 13:
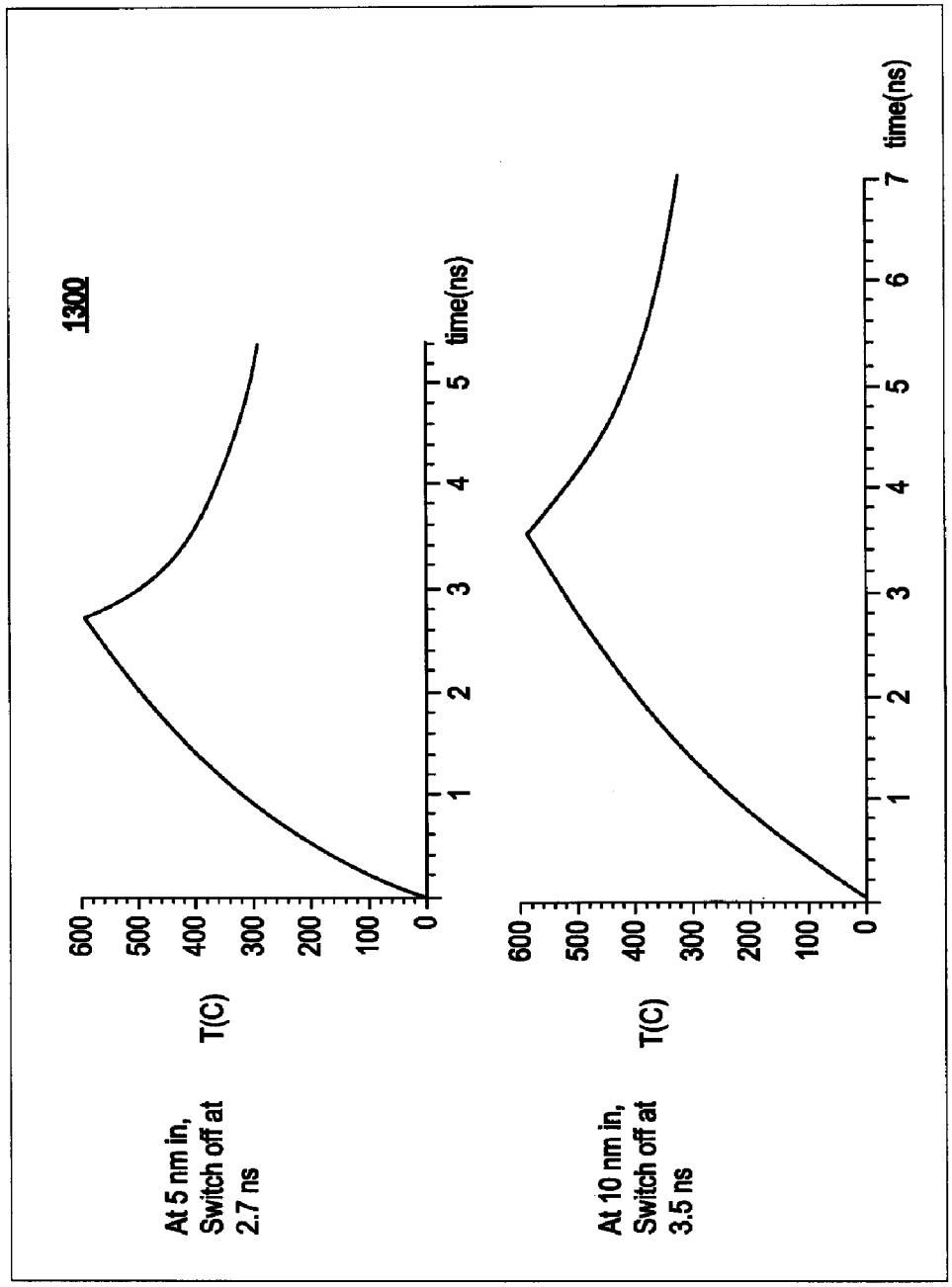
FIG. 13 shows cooling cycle curves 1300 at two depths within the GST element.

These times are seen to be in the 2–3 ns range. For amorphization, the cooling process should be rapid. FIG. 13 shows the behavior at 5 nm inside the GST if the heating is switched off after 2.7 ns, and 10 nm into the GST if it is switched off after 3.5 ns. Presumably crystallization will start as a front moving away from the crystal/melt boundary as soon as it drops below the melting temperature.

The crystalline front velocity strongly increases with temperature (hence the room-temperature stability of the amorphous phase), except close to the melting temperature. If its maximum value is, for example, 10 m/s, amorphization should occur in part of the 5 nm and 10 µnm. layers, based on the initial temperature drop in FIG. 13. A more quantitative study of these processes is included below.

The crystallization (SET) process involves holding the system below the melting temperature for a longer time than the quench time for amorphization. For crystallization to happen in approx. 2.5 ns, the crystallization front velocity should be around 2 m/s. The crystallization front velocity is very sensitive to temperature, and controlled by this means.

1-D Numerical Simulation

For a more quantitative conclusion, additional factors which should be taken into account, in addition to heat diffusion, are the latent heat of melting of the PCM and the kinetics of the propagating front corresponding to the melt interface.

This has been done using a numerical approach for heat and melt front propagation within the GST layer, again for a one-dimensional model. Including latent heat, conservation of energy modifies the diffusion equation in the GST to $$C_G \frac{d\Phi}{dt} = K_G \frac{d^2\Phi}{dt^2} - L_G \frac{df_G}{dt},$$

where $f_G(x,t)$ is the fraction of melt in the material, and $L_G$ is the latent heat per unit volume. The equation for the melt fraction dynamics is based on modified Wilson-Frenkel kinetics, which fits the melt kinetics of $GeO_2$, and, in its simplest version, takes the form $$\frac{df_G}{dt} = -V_m^0 \frac{\partial f_G}{\partial x},$$

where the melt front velocity $V_m^0$ is given by $$V_m^0 = V_0 e^{E_a^0\left(\frac{1}{k_B T_m} - \frac{1}{k_B T}\right)} \left[ e^{L^0\left(\frac{1}{k_B T_m} - \frac{1}{k_B T}\right)} - 1 \right],$$

in which $V_0$ is a characteristic velocity, $E_a^0$ is the activation energy of recrystallization, and $L^0$ the latent heat of melting. Only propagation of the melt front at $x_m$, not homogeneous nucleation, is taken into account, due to the extremely slow nucleation rate at time scales of interest in high performance PRAM.

The velocity $V_m^0$ has a maximum at T below $T_m$, given by $$V_m^{max} \simeq -\frac{V_0 L^0}{e E_a^0}, \quad \text{for } T \simeq T_m\left[1 - \frac{k_B T_m}{E_a^0}\right],$$

which provides a useful parametrization.

In practice, numerical practicalities dictate certain modifications to the basic procedure.

A typical parameter set is illustrated below in Table III. The maximum recrystallization velocity $V_m^{max}$ is the most uncertain parameter (for purpose of the present discussion, chosen herein is a value similar to that cited in J. H. Brusche, "Numerical modeling of optical phase-change recording", Report 04-04, University of Delft, Netherlands, 2004), the activation energy lies in the accepted range for GST. In the quench process prior to heater current turnoff, and in the anneal process prior to hold (after which the surface temperature is held at a constant value), the temperature boundary condition on the PCM surface is taken as having the asymptotic form going as square root of time derived above from oxide heat diffusion, the magnitude being consistent with the typical heating current levels discussed above.

TABLE III

Main Parameters in 1D Simulation

| Symbol | Value | Explanation |
|---|---|---|
| $V_m^{max}$ | 6 ms$^{-1}$ | Max recryst. velocity |
| $L_{PCM}$ | 60 nm | Thickness of PCM film |
| $T_m$ | 600° C. | Melt temp. |
| $T_{quench}^{max}$ | 738° C. | Max. transient quench temp. |
| $t_{quench}^{off}$ | 1.32 ns | Current turn-off time in quench |
| $T_{anneal}^{hold}$ | 550° C. | Hold temp. in anneal |
| $t_{anneal}^{hold}$ | 0.63 ns | Time for commence of hold in anneal |
| L | 420 Jcm$^{-3}$ | Latent heat of melting |
| $E_a$ | 2.4 eV | Activation energy |

Figure 14:
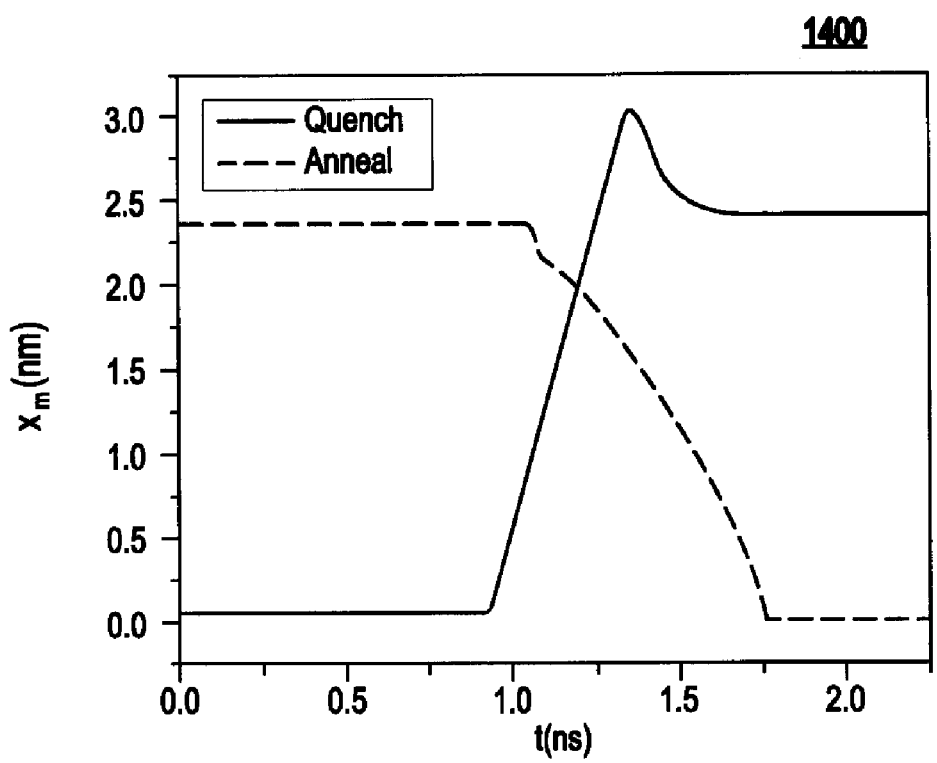
FIG. 14 shows the numerical simulation 1400 of the anneal and quench processes.

The results of the simulation with the foregoing parameters are seen in FIG. 14, showing a plot 1400 of the melt front location vs. time in the quench and anneal steps. For these parameters, the quench and anneal processes are completed in under 2 ns. Assuming the Wilson-Kramer model of melt kinetics is valid for the PCM of interest, experimental measurements of the latent heat, the recrystallization activation energy, and the maximum recrystallization velocity are required for the modeling of any particular PCM to have predictive capability.

The Scaling Aspects

In this subsection, the behavior of the device is examined, as its lateral dimension is reduced as a result of reduction in lithographic dimension. The independent variable in scaling is then taken as the device lateral dimension, b (the other lateral dimension c will be taken as proportional to b), the dependent variables as the behavior in the direction x transverse to the device plane, and the behavior in time. The device should continue to function as long as $x_m$<<b, which is satisfied down to extremely small b due to the smallness of $x_m$ (FIG. 14). As with SiO$_2$ gate oxide layers, the amorphous layer thickness $x_m$ eventually runs into atomic dimensions as scaling proceeds.

Two kinds of scaling suggest themselves. If applied power W scales as b$^2$ $$W \sim b^2,$$

(i.e., power per unit area W/b$^2$ independent of scale), then the behavior in distance x and time t is scale-invariant $$t \sim b^0, x \sim b^0.$$

An alternative possibility, for example, is for power to scale down linearly with b, $$W \sim b,$$

whence power per unit area scales up $$W/A \sim b^{-1},$$

and, hence, the scaling of time and distance in the heat diffusion equation become $$t \sim b^2, x \sim b.$$

Thus, with this scaling, the heat diffusion time scale rapidly shortens (e.g., "smaller is faster"), while the heat diffusion distance normal to plane scales the same way as the lateral distance scale b.

However, melt front propagation at constant velocity v has a time delay scaling linearly with b $$t_{front} \sim x/v \sim b,$$

and scales more slowly than heat diffusion time. Melt front propagation will then become a longer time scale than the heat diffusion time at small scales.

Basic Memory with Additional FET Switches

Figure 15:
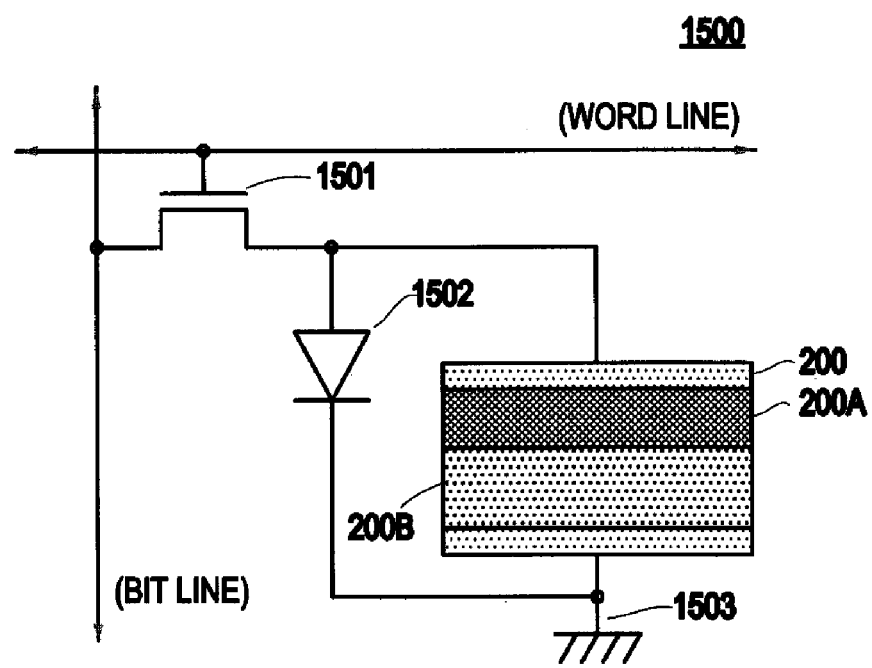
FIG. 15 illustrates an exemplary configuration 1500 of a cell unit incorporating an FET switch.

Introducing an FET switch 1501 into the FIG. 2a circuit, as shown in the circuit 1500 of FIG. 15, leads to a design for the PRAM memory very analogous to conventional DRAM, except that the DRAM capacitor is replaced by the heater diode 1502 in parallel with the phase change element 200. Note that, as in DRAM, there is now a third terminal, the common ground 1503.

Figure 16:
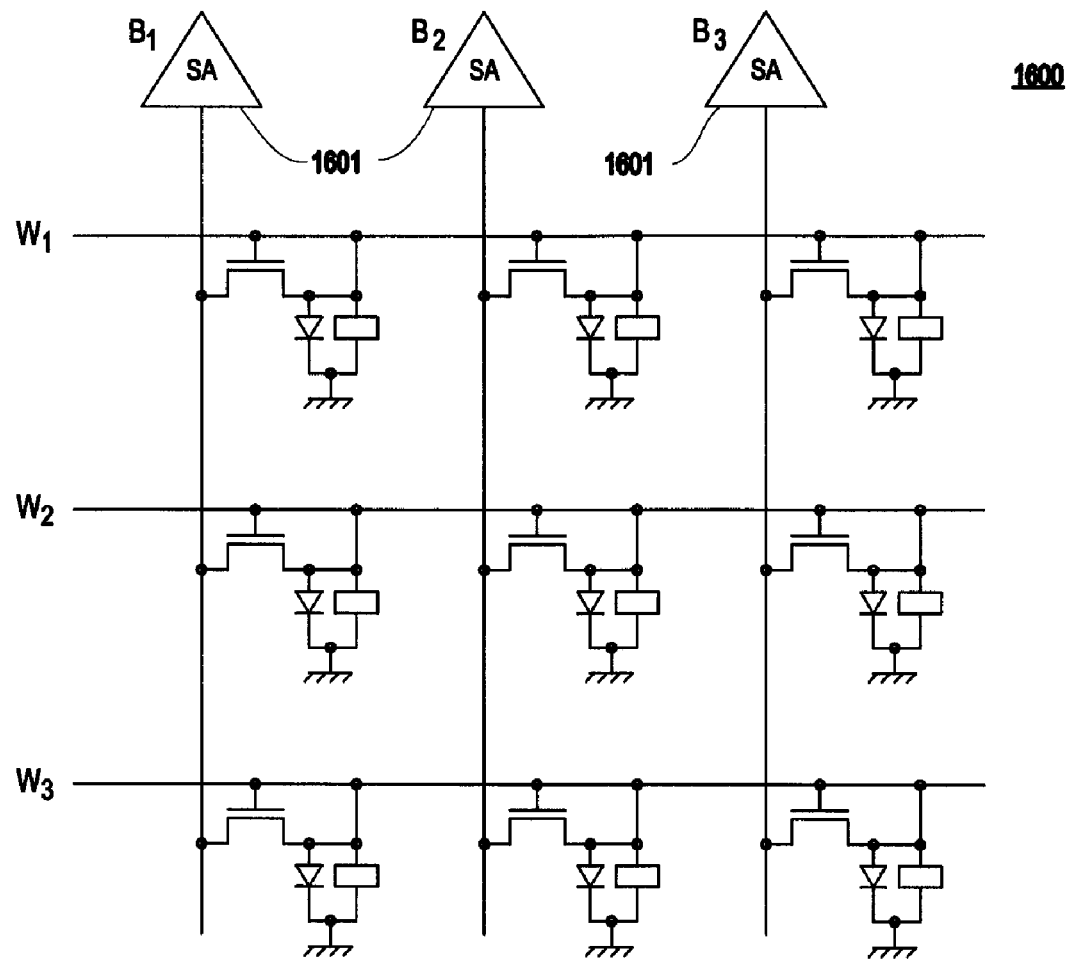
FIG. 16 exemplarily illustrates a 3×3 memory array 1600 using FET switches.

FIG. 16 illustrates an exemplary 3×3 memory matrix 1600 (a more typical realistic block size is 1024×1024) based on this configuration.

The write process involves enabling the relevant word line W$_1$,W$_2$,W$_3$, and applying a positive pulse of appropriate length to the relevant bit line B$_1$,B$_2$,B$_3$. As with DRAM, word lines not involved in a current read or write are disabled.

For a read process, the word line is again enabled, and a negative pulse applied to the bit line. If the element is in the crystalline state, current flows into the bit line, where it is detected by a sense amplifier 1601 (which actually includes a current amplifier in series with the bit line voltage source). If the memory cell is in the amorphous state, then negligible current flows. As with DRAM, a whole column may be read in one operation, but unlike DRAM, this is not necessary.

Basic Memory with Diode Switches only

Figure 17:
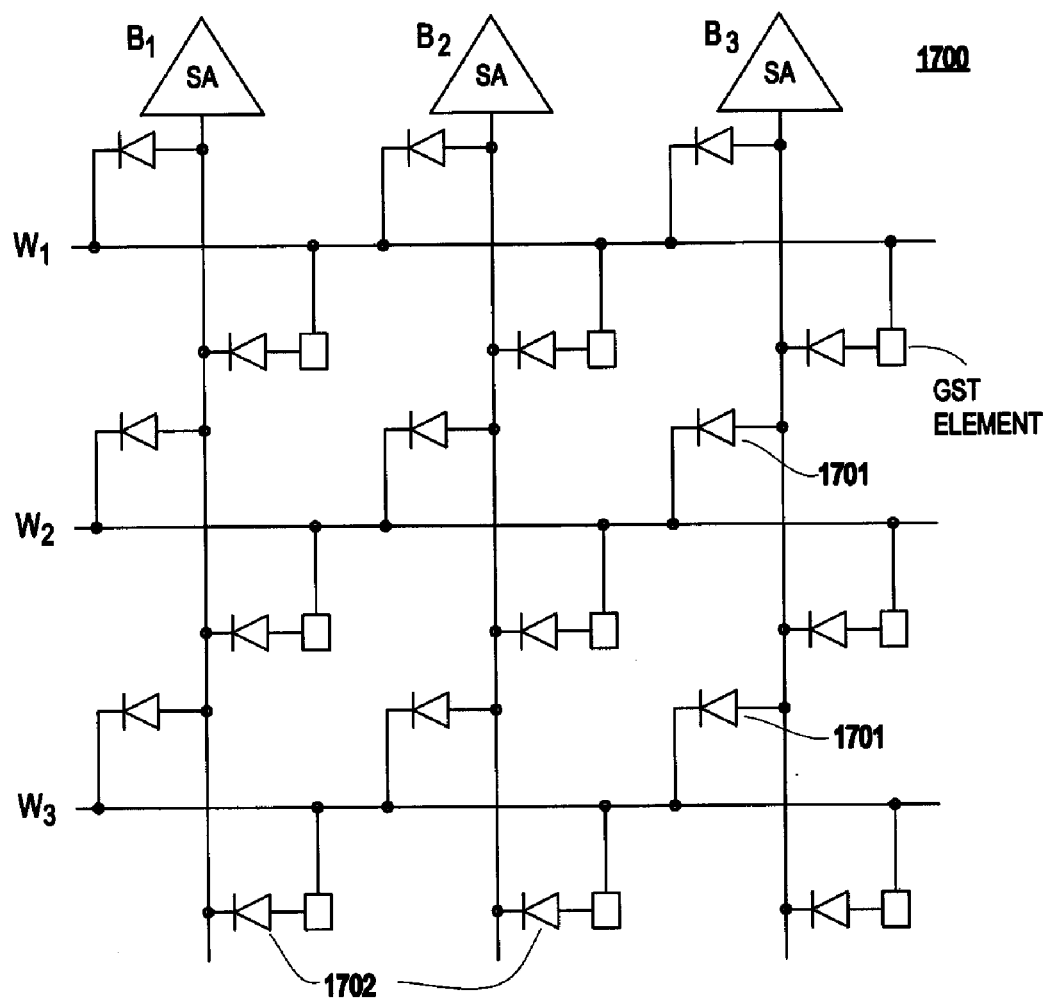
FIG. 17 exemplarily illustrates a 3×3 memory array 1700 using two diodes for switching.

Using the additional diode of FIG. 2b, or FIG. 2c, with no FET, a memory array based on switching by diode polarity and diode threshold alone is theoretically feasible, as illustrated in FIG. 17, where a 3×3 block 1700 is sketched. This design is extremely compact in terms of physical space utilization.

The procedures for write and read are as follows. Define diode threshold voltage as $V_t$ (approx. 0.7 V for Si), and assume unused leads grounded.

To write to location (m,n), a positive voltage slightly exceeding $V_t/2$ is applied to B$_n$, and a negative voltage slightly below $-V_t/2$ is applied to W$_m$, allowing current to flow through the diode 1701 at location (m,n). No other current flows, due either to blocking by a diode with wrong polarity, or to voltage lying below diode threshold. Write pulse length is short to obtain an amorphous state of GST element, and long to obtain a crystalline form.

A whole row may be read in one operation (as with DRAM). To read row m, a voltage slightly exceeding $V_t$ is applied to word line m. Current flows through the elements and diodes 1702 at locations (m,n), n=1, 2, ... 1028, into bit lines n, whence into the sense amplifier SA in bit line n. No other current flows, due either to blocking by a diode with wrong polarity, or to voltage below diode threshold.

Figure 18:
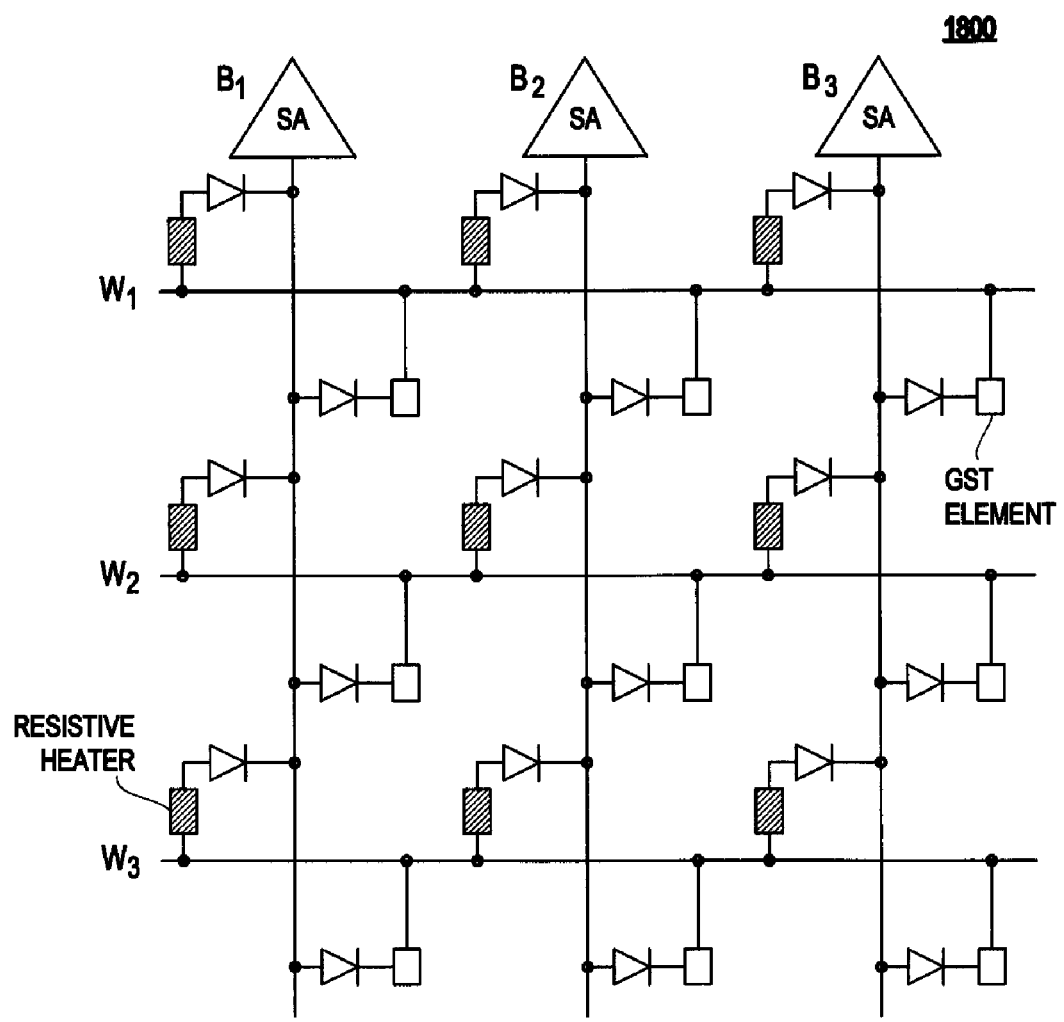
FIG. 18 exemplarily illustrates a 3×3 memory array 1800 using resistive heaters and two diode switches.

A similarly-functioning 3×3 memory matrix 1800 with the resistive heater element illustrated in FIG. 9 is exemplarily illustrated in FIG. 18.

RC Time Constant Memory Bandwidth

To provide indication of switching speed, the block physical dimension is estimated as $1.3 \times 10^{-2}$ cm. At an estimated 2 pF/cm lead capacitance per unit length, lead capacitance is on the order of $3 \times 10^{-14}$ F. Hence, for currents of 0.5 mA to charge to 1 V, the time constant is $0.4 \times 10^{-10}$ sec. This time constant is short enough so that the RC delay will not significantly affect circuit operation.

For a read, while the relatively low resistance of the GST in the FIG. 1b circuit is within the time budget, the higher resistance of the FIG. 1a circuit leads to a time constant of order $3 \times 10^{-10}$ sec, which, however, is still insignificant.

The time delays from the ancillary circuitry (e.g., code/decode, etc.) are similar to that for DRAM, which is to say, relatively long.

A 3 ns write time yields a memory bandwidth, assuming a 1024-bit word line, in simultaneous read/write mode, interfacing with a 64-bit channel, of ~5 GHz.

Thermal Budget

The formula to estimate the heat for a single write step leads to the estimate, where τ is write time, assumed to be 3 ns $$H_{wr} = 0.7 I\tau = 10^{-12} J.$$

Now, a 3 GHz computer outputting 64 b/cycle to memory, i.e. $2 \times 10^{11}$ b/sec, will therefore require a maximum 200 mW of power for writing memory. Even this maximal estimate is quite low. The power requirement for read is similar, and is lower in the FIG. 2a case than in the FIG. 2b case.

The power requirement of the ancillary circuitry (code/decode, etc.) is similar to that for DRAM.

Some Exemplary Advantages

First, some performance estimates are provided in the "Technical Estimates" section above. Moreover, in comparing the FET-switched memory array with DRAM:
1. Memory is permanent, and no refresh is needed.
2. Only one Bit and one Word line per cell is needed, as with DRAM.
3. Read and write do not have to occur for an entire word line.
4. The capacitor is replaced by the more compact GST film, the FET is replaced by combinations of FET+1–2 diodes or 2 diodes alone.
5. Read signal is larger.
6. Read and Write consume acceptable power (but this is larger than DRAM).
7. Read and Write have acceptable speed.
8. Time delays in ancillary circuitry are essentially the same as for DRAM.

Thus, the circuit of the present invention is theoretically superior to DRAM, especially if permanent storage capability is essential, as in embedded and hand-held device applications.

Compared with the conventional GST PRAM, the advantages of the design of the present invention include that:
1. Control of the switching process is precise.
2. Write times of 2–3 ns are possible within assumed melt kinetics
3. Write currents are reasonable
4. The design is flexible regarding PCM composition.
5. The planar geometry leads to understandable scaling.
6. The small amount of heated PCM leads to limited power requirements.
7. The small amount of phase-changed PCM leads to limited dimensional changes, aiding device lifetime.

Thus, the device of the present invention represents an advantageous new technology and very promising as a storage class memory.

Moreover, the high performance PRAM is suitable as a local nonvolatile memory embedded in the logic chip environment. In this application, following a run interruption, the exact logic state of the system can be restored, enabling seamless continuation of the interrupted task. A second application is in hand-held devices, where the nonvolatile and high density properties of PRAM enable it to replace the compact disk, thereby enhancing miniaturization.

It is also noted in passing that, although the present invention is described as using two information states, such limitation is not required, since the phase boundary can be controlled so that resistance of the PCM element lies within any of a plurality of predetermined ranges of resistance values, each range representing an unique information state.

While the invention has been described in terms of exemplary embodiments, those skilled in the art will recognize that the invention can be practiced with modification within the spirit and scope of the appended claims.

Further, it is noted that Applicants' intent is to encompass equivalents of all claim elements, even if amended later during prosecution.

Having thus described our invention, what we claim as new and desire to secure by Letters Patent is as follows:

1. A memory cell, comprising:
   a phase change material (PCM) element; and
   a heating element external to said PCM element,
   wherein said heating element causes one of a presence of and an absence of a phase boundary within said PCM element for storing information in said PCM element.

2. The memory cell of claim 1, wherein said phase boundary separates said PCM element into a first region having a first phase and a second region having a second phase, said phase boundary thereby defining one of at least two information states possible to store in said PCM element.

3. The memory cell of claim 1, wherein said phase boundary occurs within a nanoscopic distance of a surface of said PCM element closest to said heating element, said nanoscopic distance being a depth of said PCM element of approximately 2 to 10 nm.

4. The memory cell of claim 3, wherein said surface of said PCM element closest to said heating element is contiguous to a surface of said heating element.

5. The memory cell of claim 1, wherein said PCM comprises a chalcogenide having at least two elements of Ge (Germanium), Sb (Antimony), and Te (Tellurium).

6. The memory cell of claim 1, wherein said heating element comprises at least one of:
   a pn junction diode;
   a Schottky diode; and
   a resistive element.

7. The memory cell of claim 1, wherein said heating element is at least partially embedded in a thermally insulative layer.

8. The memory cell of claim 1, further comprising:
   at least one diode to preclude a current passage during at least one operational phase of said memory cell.

9. The memory cell of claim 1, wherein a switching speed of said memory cell is approximately 10 nsec or less.

10. The memory of claim 1, wherein said heating element also serves a switching function.

11. The memory cell of claim 1, further comprising:
    a switching element to control application of a voltage to said memory cell.

12. The memory cell of claim 11, wherein said switching element comprises one of a:
   field effect transistor (FET); and
   a diode.

13. The memory cell of claim 1, wherein said memory cell comprises one of a plurality of such memory cells arranged in an away of rows and columns to form a memory array, said memory away further comprising:
   a word line for each said row, said word line connected to each memory cell in said row;
   a bit line for each column, said bit line connected to each memory cell in said column; and
   a sense amplifier in each said bit line.

14. The memory cell of claim 1, wherein said phase boundary is quasi planar.

15. The memory cell of claim 1, wherein said phase boundary occurs within a predetermined depth of a surface of said PCM element, and said memory cell has a scalability feature permitting said memory cell to be scaled down to a size of an order corresponding to said predetermined depth.

16. An apparatus, comprising:
   a non-volatile memory array, comprising:
      a plurality of memory cells arranged in an array of rows and columns;
      a word line for each said row, said word line connected to each memory cell in said row;
      a bit line for each column, said bit line connected to each memory cell in said column; and
      a sense amplifier in each said bit line,
   wherein at least one of said memory cells comprises:
      a phase change material (PCM) element; and
      a heating element external to said PCM element, and
   wherein said heating element can be controlled to selectively cause one of a presence of and an absence of a phase boundary within said PCM element for storing information in said PCM element.

17. A method of increasing performance in a phase change material (PCM) memory cell, said method comprising:
   using an external heater in close proximity to said phase change material to change a phase of a portion of said PCM, wherein only a thin surface layer of said PCM is used as a storage region for an information bit.

18. The method of claim 17, wherein said thin surface layer comprises a nanoscopic thickness of said PCM, said nanoscopic thickness being approximately 2–10 nm.

19. The method of claim 17, wherein said heater causes a switching speed of said thin layer of said PCM of approximately 10 nsec or less.

20. A method of forming a non-volatile memory cell, said method comprising:
   forming a heating element on a substrate; and
   forming a portion of phase change material (PCM) in close proximity to said heating element, wherein said heating element can be controlled to selectively cause one of a presence of and an absence of a phase boundary within said PCM element for storing information in said PCM element.

\* \* \* \* \*

UNITED STATES PATENT AND TRADEMARK OFFICE
CERTIFICATE OF CORRECTION

PATENT NO. : 7,221,579 B2
APPLICATION NO. : 11/150188
DATED : May 22, 2007
INVENTOR(S) : Lia Krusin-Elbaum et al.

It is certified that error appears in the above-identified patent and that said Letters Patent is hereby corrected as shown below:

Claims

In claim 1, col. 16, line 6, after the words "PCM element", insert the words --, said phase boundary presence defining one of a plurality of information states possible for said PCM element--.

In claim 16, line 16, after the words "PCM element", insert the words --, said presence of said phase boundary indicative of at least one of plurality of information states that can be stored in said PCM element--.

In claim 20, line 9, after the words "PCM element", insert the words --, wherein said phase boundary absence indicates a first information state and said phase boundary presence indicates at least one other information state than said first information state--.

Signed and Sealed this

Twenty-fourth Day of July, 2007

JON W. DUDAS
*Director of the United States Patent and Trademark Office*